(12) United States Patent
Yanagisawa

(10) Patent No.: US 10,996,549 B2
(45) Date of Patent: May 4, 2021

(54) PROJECTOR WITH POLARIZATION ELEMENT COOLED WITH COOLING LIQUID

(71) Applicant: SEIKO EPSON CORPORATION, Tokyo (JP)

(72) Inventor: Yoshiyuki Yanagisawa, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/260,386

(22) Filed: Jan. 29, 2019

(65) Prior Publication Data

US 2019/0235367 A1    Aug. 1, 2019

(30) Foreign Application Priority Data

Jan. 29, 2018  (JP) .............................. JP2018-013008
Sep. 21, 2018  (JP) .............................. JP2018-177363

(51) Int. Cl.
  *G03B 21/16*     (2006.01)
  *H04N 5/74*      (2006.01)
  (Continued)

(52) U.S. Cl.
  CPC ....... *G03B 21/16* (2013.01); *G02F 1/133385* (2013.01); *G06F 1/20* (2013.01);
  (Continued)

(58) Field of Classification Search
  CPC .............. G03B 21/16; G02F 1/133385; H04N 5/7441; H04N 9/3105; H04N 9/3144;
  (Continued)

(56) References Cited

U.S. PATENT DOCUMENTS 5,170,195 A * 12/1992 Akiyama .......... G02F 1/133385
                                                349/161
6,256,083 B1 * 7/2001 Numata ............ G02F 1/133385
                                                348/E5.141
(Continued)

FOREIGN PATENT DOCUMENTS

JP        H11-282361 A    10/1999
JP        2002-107698 A    4/2002
(Continued)

*Primary Examiner* — Michelle M Iacoletti
*Assistant Examiner* — Magda Cruz
(74) *Attorney, Agent, or Firm* — Oliff PLC

(57) ABSTRACT

A projector includes a light source, a light modulation device configured to modulate light emitted from the light source, a polarization element arranged to one of a light incident side and a light exiting side of the light modulation device, a projection device configured to project the light modulated by the light modulation device, a casing in which the polarization element is arranged and whose inside is filled with a cooling liquid, and a circulation device configured to circulate the cooling liquid in the casing onto the polarization element. The cooling liquid circulates along a first direction on the light incident side of the polarization element. The cooling liquid circulates along a second direction opposite to the first direction on the light exiting side of the polarization element.

8 Claims, 13 Drawing Sheets

(51) Int. Cl.
*H04N 9/31* (2006.01)
*G02F 1/1333* (2006.01)
*G06F 1/20* (2006.01)
*H05K 7/20* (2006.01)

(52) U.S. Cl.
CPC ......... *H04N 5/7441* (2013.01); *H04N 9/3105* (2013.01); *H04N 9/3144* (2013.01); *H05K 7/20236* (2013.01); *H05K 7/20272* (2013.01); *H05K 7/20981* (2013.01)

(58) Field of Classification Search
CPC .. G06F 1/20; H05K 7/20272; H05K 7/20236; H05K 7/20981
See application file for complete search history.

(56) References Cited

U.S. PATENT DOCUMENTS

| | | | |
|---|---|---|---|
| 6,991,335 B2 | 1/2006 | Kondo et al. | |
| 7,213,925 B2 | 5/2007 | Fujimori et al. | |
| 8,651,668 B2 | 2/2014 | Yanagisawa et al. | |
| 2004/0257538 A1* | 12/2004 | Kondo | G03B 21/16 353/54 |
| 2005/0185146 A1 | 8/2005 | Fujimori et al. | |
| 2007/0203267 A1* | 8/2007 | Richard | G02F 1/133606 524/47 |
| 2008/0225188 A1 | 9/2008 | Hoshino et al. | |
| 2010/0033687 A1* | 2/2010 | Utsunomiya | G03B 21/16 353/58 |
| 2010/0245778 A1 | 9/2010 | Yanagisawa et al. | |
| 2011/0085301 A1* | 4/2011 | Dunn | H05K 7/20972 361/695 |
| 2014/0016059 A1* | 1/2014 | Lee | G02B 5/3058 349/46 |
| 2016/0289458 A1* | 10/2016 | Linford | C23C 16/24 |
| 2017/0273223 A1 | 9/2017 | Saito | |

FOREIGN PATENT DOCUMENTS

| | | | | |
|---|---|---|---|---|
| JP | 2002-131737 A | 5/2002 | | |
| JP | 2002-236277 A | 8/2002 | | |
| JP | 2002-244101 A | 8/2002 | | |
| JP | 2002-258245 A | 9/2002 | | |
| JP | 2005-010630 A | 1/2005 | | |
| JP | 2005-227685 A | 8/2005 | | |
| JP | 2006-017833 A | 1/2006 | | |
| JP | 2006-098759 A | 4/2006 | | |
| JP | 2006-106250 A | 4/2006 | | |
| JP | 2006-330641 A | 12/2006 | | |
| JP | 2006-330642 A | 12/2006 | | |
| JP | 2007-294655 A | 11/2007 | | |
| JP | 2010170905 A | * 8/2010 | ............... | F21S 8/10 |
| JP | 2010-224439 A | 10/2010 | | |
| JP | 2012-198401 A | 10/2012 | | |
| JP | 2012-198402 A | 10/2012 | | |
| JP | 5853072 B1 | 2/2016 | | |
| JP | 2016-195215 A | 11/2016 | | |

* cited by examiner

PROJECTOR WITH POLARIZATION ELEMENT COOLED WITH COOLING LIQUID

BACKGROUND

1. Technical Field

The present invention relates to a projector.

2. Related Art

According to the related art, a projector having: a light source; a light modulation device which modulates light emitted from the light source and thus forms an image corresponding to image information; and a projection device which projects the image formed by the light modulation device in an enlarged form, is known. As such a projector, a projector in which the light modulation device as a cooling target object is cooled by cooling air is known (see, for example, JP-A-2002-107698).

In the projector disclosed in JP-A-2002-107698, three liquid crystal display elements, each of which is a light modulation device, are fixed to a dichroic prism and a cooling fan is provided below the three liquid crystal display elements. Cooling air sent from the cooling fan is supplied to the lower end surface of each liquid crystal display element via an opening provided in an air guide plate. The cooling air then circulates upward between the light incident-side surface of each liquid crystal display element and a polarizer situated to the light exiting side of each liquid crystal display element, removing heat from the surface of the liquid crystal display element. Each liquid crystal display element is thus cooled.

Meanwhile, an electronic apparatus in which a liquid refrigerant is circulated to cool a heat generating component is known (see, for example, JP-A-2007-294655).

The electronic apparatus disclosed in JP-A-2007-204655 has a cooling device which cools the heat generating component as a cooling target object. The cooling device has a heat receiving unit, a heat radiating unit, a fan, a tank, a pump, and a pipe connecting these components to form a circulation path. Of these, the heat of the heat generating component received by the heat receiving unit is transmitted to the liquid refrigerant circulating on the heat receiving unit and is radiated via the heat radiating unit. The fan sends air to the heat radiating unit and thus facilitates the heat radiation via the heat radiating unit. The tank stores the liquid refrigerant. The pump supplies the liquid refrigerant in the tank to the heat receiving unit.

Incidentally, in the case where a liquid crystal display element is employed as a light modulation device, as in JP-A-2002-107698, it is common to arrange a polarization element to the light incident side and the light exiting side of the liquid crystal display element. Such a polarization element has the property of absorbing light in a certain direction of polarization and therefore tends to generate heat and also deteriorate due to heat. Therefore, the polarization element needs to be cooled.

However, with the configuration in which cooling air is sent to the polarization element to cool the polarization element as disclosed in JP-A-2002-107698 or the configuration in which the polarization element is indirectly cooled via the liquid refrigerant as disclosed in JP-A-2007-294655, it may be difficult to sufficiently cool the polarization element.

To cope with such a problem, a configuration in which the polarization element is immersed in a cooling liquid and thus cooled may be employed.

However, with such a configuration, the density and hence the refractive index of the liquid change according to temperature change and therefore an image projected by the projector deteriorates in the following manner.

For example, if the cooling liquid is circulated from one end side to the other end side of the polarization element situated to the light incident side of the liquid crystal display element, the temperature of the cooling liquid, to which the heat of the polarization element is transmitted, rises as it goes toward the other end side. Therefore, the refractive index of the cooling liquid differs between the one end side and the other end side of the polarization element. Such uneven refractive index distribution causes a difference between the illuminance of light passing through the one end side of the polarization element and the illuminance of light passing through the other end side and therefore causes uneven illuminance distribution in a luminous flux that becomes incident on the liquid crystal display element. Thus, uneven illuminance is observed in an image projected by the projector based on the light modulated by the liquid crystal display element.

Meanwhile, if the cooling liquid is circulated from one end side toward the other end side of the polarization element situated to the light exiting side of the liquid crystal display element, the temperature of the cooling liquid, to which the heat of the polarization element is transmitted, similarly rises as it goes toward the other end side. If uneven refractive index distribution occurs in the cooling liquid circulating along the polarization element as described above, the back focus position of the projection device, which projects a luminous flux emitted from the liquid crystal display element, changes locally in the liquid crystal display element. That is, the back focus position becomes locally inconsistent with the liquid crystal display element. If such local change in the back focus position occurs, a phenomenon such as a shift of the center position of a part of the pixels of a projected image or a change in the size of the pixel (uneven resolution) is observed.

To cope with these problems, a configuration to effectively cool the polarization element as a cooling target object while restraining deterioration of the projected image is demanded.

SUMMARY

An advantage of some aspects of the invention is that a projector in which deterioration of an image can be restrained and in which the polarization element can be effectively cooled is provided.

A projector according to an aspect of the invention includes a light source, a light modulation device configured to modulate light emitted from the light source, a polarization element arranged to one of a light incident side and a light exiting side of the light modulation device, a projection device configured to project the light modulated by the light modulation device, a casing in which the polarization element is arranged and whose inside is filled with a cooling liquid, and a circulation device configured to circulate the cooling liquid in the casing onto the polarization element. The cooling liquid circulates along a first direction on the light incident side of the polarization element and circulates along a second direction opposite to the first direction on the light exiting side of the polarization element.

In this configuration, the cooling liquid in the casing circulates along the first direction on the light incident side of the polarization element and circulates along the direction opposite to the first direction on the light exiting side of the polarization element. Thus, the temperature distribution of the cooling liquid circulating on the light incident side of the polarization element and the temperature distribution of the cooling liquid circulating on the light exiting side can complement each other. That is, the temperature distribution of the cooling liquid which circulates on the light incident side and the light exiting side of the polarization element and through which the light passes can be made substantially even. Therefore, the light passing through the polarization element can be regarded as the light passing through the cooling liquid having substantially even refractive index distribution. Thus, if the polarization element is situated to the light incident side of the light modulation device, the illuminance distribution of the light incident on the light modulation device can be made substantially even. This can restrain the occurrence of uneven illuminance. If the polarization element is situated to the light exiting side of the light modulation device, the local change in the back focus position can be restrained. This can restrain the occurrence of uneven resolution. Thus, deterioration of an image projected and displayed by the projection device can be restrained.

In the aspect of the invention, it is preferable that a flow velocity of the cooling liquid circulating on the light incident side of the polarization element is substantially the same as a flow velocity of the cooling liquid circulating on the light exiting side of the polarization element.

The case where the flow velocities are substantially the same includes the case where the flow velocities can be regarded as coincident with each other since the difference between the flow velocities is within a predetermined range, as well as the case where the flow velocities are perfectly coincident with each other.

In such a configuration, the light incident side and the light exiting side of the polarization element can be cooled substantially evenly. Also, the temperature distribution of the cooling liquid circulating on the light incident side of the polarization element and the temperature distribution of the cooling liquid circulating on the light exiting side can be made substantially coincident with each other. Moreover, the refractive index distribution of the cooling liquid circulating on the light incident side of the polarization element and the refractive index distribution of the cooling liquid circulating on the light exiting side can be made substantially coincident with each other. Therefore, the refractive index distribution of the cooling liquid can be made substantially even between the light incident side and the light exiting side of the polarization element. Thus, deterioration of a projected image can be restrained more effectively.

In the aspect of the invention, it is preferable that the polarization element is disposed on the light exiting side of the light modulation device.

Such a configuration can restrain the occurrence of uneven resolution in a projected image as described above and thus can provide a projector having little image deterioration.

In the aspect of the invention, it is preferable that the projector includes a plurality of the light modulation devices corresponding respectively to a plurality of color lights including green light and a light combining device configured to combine the color lights modulated respectively by the plurality of the light modulation devices, and that the polarization element is disposed on the light exiting side of the light modulation device corresponding to the green light.

Generally, of the light emitted from the light source, the green light has a greater amount of light than the other color lights. The polarization element arranged to the light exiting side of the light modulation device corresponding to the green light, for example, the polarization element on which the green light modulated according to image information by a transmission-type light modulation device becomes incident, absorbs light modulated in a predetermined direction of polarization, based on image information, as described above. Therefore, the polarization element on which the green light becomes incident tends to have a relatively high temperature. Particularly, the polarization element can easily deteriorate depending on temperature. Therefore, the polarization element for the green light needs to be cooled effectively.

In the above configuration, the cooling liquid circulates on the light incident side and the light exiting side of the polarization element corresponding to the green light and can effectively cool the polarization element. Thus, a longer life of the polarization element and hence of the projector can be achieved.

In the aspect of the invention, it is preferable that the polarization element is disposed on the light incident side of the light modulation device.

Such a configuration can restrain the occurrence of uneven illuminance in a projected image as described above and thus can provide a projector having little image deterioration.

In the aspect of the invention, it is preferable that the polarization element has a plurality of protrusions extending along a predetermined direction and arranged in a direction intersecting the predetermined direction, on one surface of a light incident surface and a light exiting surface, and that the cooling liquid circulating on the one surface circulates along the predetermined direction in which the plurality of protrusions extend.

An example of such a polarization element may be a wire grid polarizer having a substrate with a recessed/protruding structure formed thereon.

If the cooling liquid circulates along the direction of arrangement of the plurality of protrusions, the velocity boundary layer of the cooling liquid becomes thicker due to the protrusions. Thus, the cooling efficiency for the polarization element drops.

Meanwhile, if the cooling liquid circulates along the predetermined direction, which is the direction of extension of each protrusion, the velocity boundary layer can be made thinner and the cooling efficiency for the polarization element can be increased. Thus, the polarization element can be cooled effectively.

In the aspect of the invention, it is preferable that the cooling liquid is a fluorine-based inert liquid.

As the fluorine-based inert liquid, for example, Fluorinert (trademark of 3M) or NOVEC (registered trademark of 3M) can be used.

Such a configuration enables the light modulation device, which is an electronic component, to operate in the state of being immersed in the cooling liquid. This enables the light modulation to operate stably while being cooled. Thus, the projector can operate stably.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described with reference to the drawings.

Schematic Configuration of Projector

Figure 1:
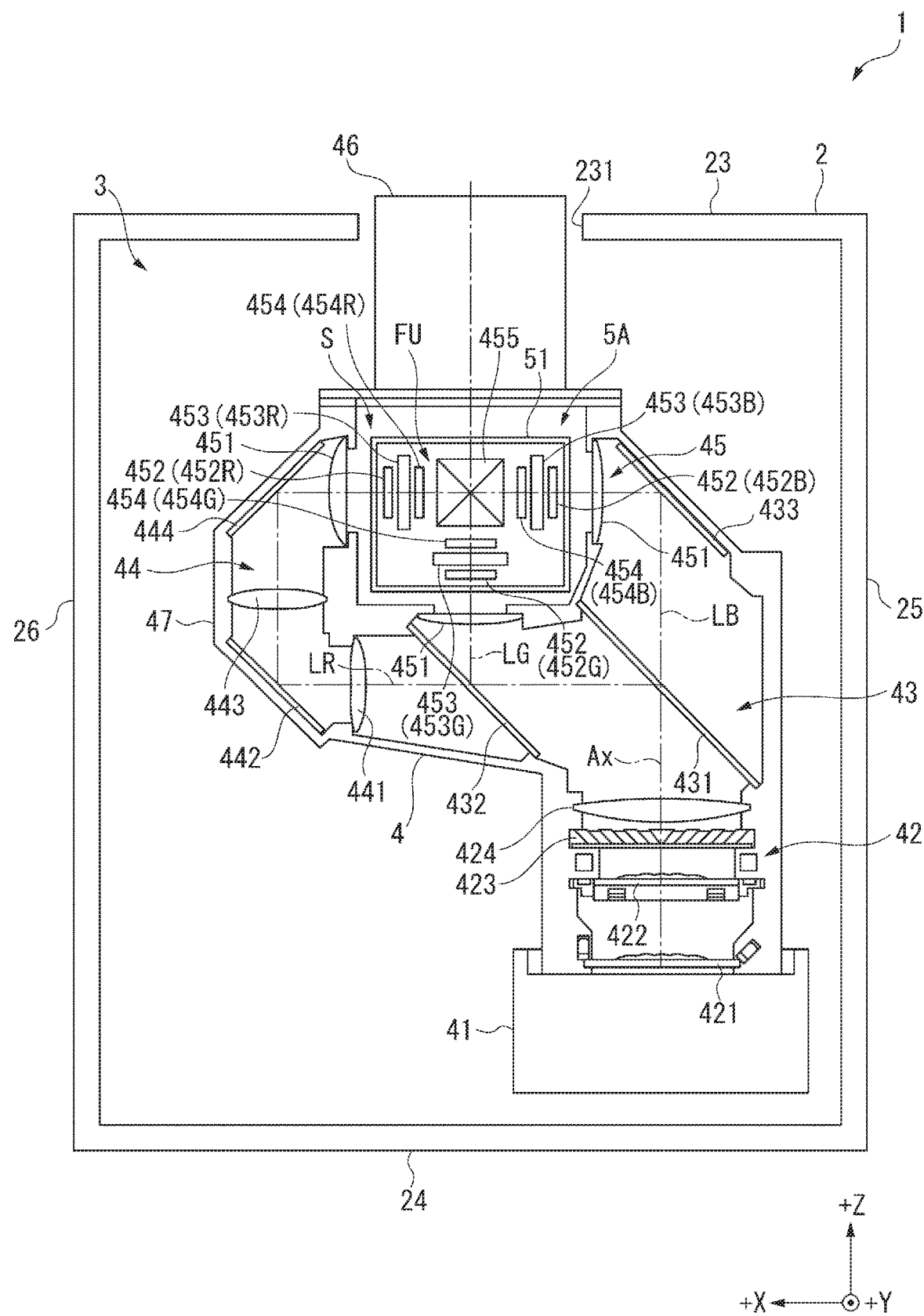
FIG. 1 is a schematic view showing the configuration of a projector according to a first embodiment of the invention.

FIG. 1 is a schematic view showing the configuration of a projector 1 according to this embodiment.

The projector 1 according to this embodiment is a projection-type display device which modulates light emitted from a light source 41 provided inside, thus forms an image corresponding to image information, and projects the image on a projection surface such as a screen, in an enlarged form. The projector 1 has an outer casing 2 which forms the appearance, and a device main body 3 accommodated inside the outer casing 2, as shown in FIG. 1. One of the features of the projector 1 is in the configuration of a cooling device 5A, as described in detail later.

The configuration of the projector 1 is described in detail below.

Configuration of Outer Casing

The outer casing 2 is formed substantially in the shape of a rectangular parallelepiped. The outer casing 2 has a front surface part 23, a rear surface part 24, a left surface part 25 and a right surface part 26, and also has a top surface part that connects one end side of these surface parts 23 to 26, and a bottom surface part that connects the other end side of these surface parts 23 to 26, though the top and bottom surface parts are not illustrated in the drawing. The bottom surface part is a surface which faces the installation surface of the projector 1 and where a plurality of leg parts are arranged.

The front surface part 23 has an opening 231. Via this opening 231, a part of a projection device 46 described later is exposed and an image is projected by the projection device 46.

Configuration of Device Main Body

The device main body 3 has an image projection device 4 and the cooling device 5A. The device main body 3 also has a control device which controls the operation of the projector 1, and a power supply device which supplies electric power to electronic components forming the projector 1, though these are not illustrated in FIG. 1.

Configuration of Image Projection Device

The image projection device 4 forms an image corresponding to image information (including an image signal) inputted from the control device and projects the image on the projection surface. The image projection device 4 has a light source 41, a uniformizing device 42, a color separation device 43, a relay device 44, an image forming device 45, a projection device 46, and an optical component casing 47.

The light source 41 emits illuminating light to the uniformizing device 42. An example of the configuration of such a light source 41 may be a configuration having a solid-state light source such as an LD (laser diode) which emits blue light as excitation light and a wavelength conversion element which converts a part of the blue light emitted from the solid-state light source into fluorescence including green light and red light. Another example of the configuration of the light source 41 may be a configuration having a light source lamp such as an ultra-high-pressure mercury lamp, as the light source, or a configuration having another solid-state light source such as an LED (light emitting diode).

The uniformizing device 42 makes the illuminance even within a plane orthogonal to the center axis of the luminous flux incident from the light source 41. The uniformizing device 42 has a first lens array 421, a second lens array 422, a polarization conversion element 423, and a superimposing lens 424. The uniformizing device 42 may also include a light adjusting device which blocks a part of the luminous flux passing through the uniformizing device 42 and thus adjusts the amount of light transmitted.

Of these, the polarization conversion element 423 emits the entire luminous flux incident from the second lens array 422, as one type of linearly polarized light.

The color separation device 43 separates red light LR, green light LG, and blue light LB from the luminous flux incident from the uniformizing device 42. The color separation device 43 has a dichroic mirror 431 which reflects the red light LR and the green light LG and transmits the blue light LB, a dichroic mirror 432 which transmits the red light LR and reflects the green light LG, and a reflection mirror 433 which reflects the separated blue light LB toward a field lens 451 for blue light, described later. The green light LG reflected by the dichroic mirror 432 becomes incident on a field lens 451 for green light.

The relay device 44 has a light incident-side lens 441, a reflection mirror 442, a relay lens 443, and a reflection mirror 444 each provided on the optical path of the separated red light LR, and guides the red light LR to a field lens 451 for red light. While the image projection device 4 in this embodiment is configured to pass on the red light LR to the relay device 44, the image projection device 4 is not limited to this configuration and may be configured to pass on, for example, the blue light LB.

The image forming device 45 modulates each color light of the light incident thereon, combines the modulated color lights, and thus forms an image corresponding to the image information. The image forming device 45 has a field lens 451, a light incident-side polarizer 452, a light modulation device 453, and a light exiting-side polarizer 454, provided for each of the three color lights LR, LG, LB, and has one light combining device 455.

The light incident-side polarizer 452 is arranged to the light incident side of the light modulation device 453, described later. The light incident-side polarizer 452 includes a light incident-side polarizer 452R corresponding to the red light LR, a light incident-side polarizer 452G corresponding to the green light LG, and a light incident-side polarizer 452B corresponding to the blue light LB.

The light exiting-side polarizer 454 is arranged to the light exiting side of the light modulation device 453. The light exiting-side polarizer 454 includes a light exiting-side polarizer 454R corresponding to the red light LR, a light exiting-side polarizer 454G corresponding to the green light LG, and a light exiting-side polarizer 454B corresponding to the blue light LB.

As the light incident-side polarizer 452 and the light exiting-side polarizer 454 in this embodiment, a wire grid polarization element PP (see FIGS. 3 and 4) is employed, as described in detail later. That is, the polarization element PP in this embodiment corresponds to the light incident-side polarizer 452 and the light exiting-side polarizer 454.

The light modulation device 453 modulates the light emitted from the light source 41, according to image information. The light modulation device 453 includes a light modulation device 453R corresponding to the red light LR, a light modulation device 453G corresponding to the green light LG, and a light modulation device 453B corresponding to the blue light LB. In this embodiment, the light modulation device 453 has a transmission-type liquid crystal panel having a light incident surface and a light exiting surface that are different from each other.

The light combining device 455 combines together the color lights modulated by the respective light modulation devices 453 and transmitted through the light exiting-side polarizers 454. The light combining device 455 in this embodiment is made up of a cross dichroic prism substantially in the shape of a rectangular parallelepiped and has three light incident surfaces 455B, 455G, 455R (see FIG. 2) on which the color lights modulated by the respective light modulation devices 453 become incident, and one light exiting surface 455E (see FIG. 2) from which image light (light that forms an image) made up of these color light combined together. The image light exiting from the light exiting surface 455E becomes incident on the projection device 46.

The three light modulation devices 453 and three light exiting-side polarizers 454 forming such an image forming device 45 are held on and integrated with the corresponding light incident surfaces 455B, 455G, 455R in the light combining device 455, by a holding member, not illustrated.

In the description below, the light incident-side polarizers 452, the light modulation devices 453, the light exiting-side polarizers 454, and the light combining device 455 are collectively referred to as an image forming unit FU. The image forming unit FU is arranged inside a casing 51 of the cooling device 5A, described later.

The projection device 46 projects the image light incident from the light combining device 455 onto the projection surface in an enlarged form and thus displays an image formed by the image light onto the projection surface. That is, the projection device 46 projects the light modulated by the light modulation devices 453R, 453G, 453B. The projection device 46 is formed as a lens set made up of a plurality of lenses arranged in a lens barrel.

The optical component casing 47 holds the foregoing devices 42 to 44 and the field lenses 451.

In the image projection device 4, an illumination optical axis Ax is set, which is the optical axis in the design. The optical component casing 47 holds the devices 42 to 44 and the field lenses 451 at predetermined positions on the illumination optical axis Ax. In the optical component casing 47, a space S where the image forming unit FU and the casing 51 of the cooling device 5A are arranged is formed at a position surrounded on three sides by the field lenses 451.

The light source 41 and the projection device 46 are arranged at predetermined positions on the illumination optical axis Ax.

In the description below, a direction from the rear surface part 24 toward the front surface part 23 is defined as +Z direction, and directions intersecting the +Z direction and intersecting each other are defined as +X direction and +Y direction. Of the +X direction and the +Y direction, the +X direction is a direction from the left surface part 25 toward the right surface part 26, and the +Y direction is a direction from the bottom surface part toward the top surface part. That is, when viewed from the +Y direction, the +Z direction is a direction in which the projection device 46 projects image light along the center axis of the projection device 46. The direction opposite to the +Z direction is defined as −Z direction, though not illustrated. The −X direction and −Y direction are similarly defined. In the embodiment, the +X direction, +Y direction, and +Z direction are prescribed as directions orthogonal to each other.

Configuration of Cooling Device

Figure 2:
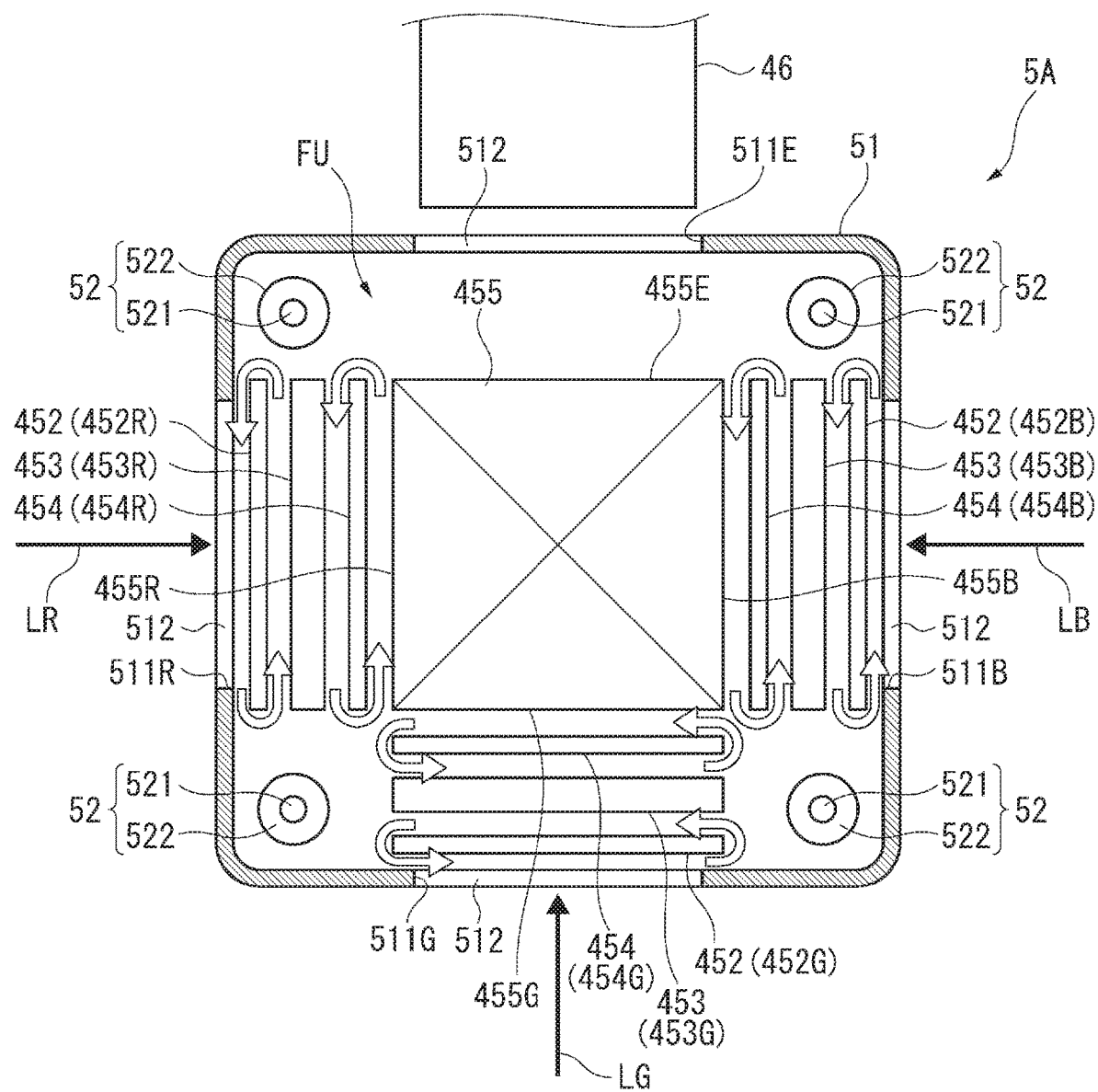
FIG. 2 is a schematic view showing the configuration of a cooling device in the first embodiment.

FIG. 2 is a schematic view showing the configuration of the cooling device 5A and schematically showing a cross section of the cooling device 5A along an XZ plane.

The cooling device 5A cools the image forming unit FU, which is one of the cooling target objects of the projector 1. The cooling device 5A has the casing 51 arranged inside the space S, as shown in FIGS. 1 and 2, and also has a circulation device 52, as shown in FIG. 2.

Configuration of Casing

The casing 51 is a casing in which the image forming unit FU including the polarization element PP is arranged, and is formed substantially in the shape of a rectangular parallelepiped, as shown in FIG. 2. The casing 51 has openings 511B, 511G, 511R, 511E in different lateral surface parts.

The openings 511B, 511G, 511R are formed at positions facing the light incident surfaces of the corresponding light incident-side polarizers 452B, 452G, 452R. The openings 511B, 511G, 511R are openings through which the blue light LB, the green light LG, and the red light LR transmitted through the corresponding field lenses 451 (see FIG. 1) pass.

The opening 511E is formed at a position facing the light exiting surface 455E of the light combining device 455. The opening 511E is an opening through which the image light emitted from the light exiting surface 455E passes.

In the openings 511B, 511G, 511R, 511E, a light-transmissive member 512 is fitted. The openings 511B, 511G, 511R, 511E are closed by the light-transmissive member 512.

Such a casing 51 is formed as a sealed casing in which a cooling liquid is enclosed. That is, the inside of the casing 51 is filled with the cooling liquid, and the image forming unit FU is immersed in the cooling liquid.

The sealed casing includes a simple sealed structure, provided that the cooling liquid in the casing 51 is restrained from leaking out of the casing 51, such as a structure in which a part of the lateral surface parts of the casing 51 is removably attached via a packing or the like.

As the cooling liquid, an inert liquid that does not affect the operation of the light modulation device 453 supplied and driven with power and image information (particularly a fluorine-based inert liquid) can be used. As such a fluorine-based inert liquid, for example, Fluorinert (trademark of 3M) or NOVEC (registered trademark of 3M) can be employed.

Configuration of Circulation Device

The circulation device 52 stirs the cooling liquid in the casing 51 and thus circulates the cooling liquid in the casing 51. Thus, the circulation device 52 circulates the cooling liquid through the image forming unit FU. The circulation device 52 in this embodiment has a motor (not illustrated), a shaft 521 rotated by the motor, and an impeller 522 provided on the outer circumference of the shaft 521. With such a configuration, it is possible to arrange the shaft 521 and impeller 522 for stirring the cooling liquid, inside the casing 51, and to arrange the motor as a heat generation source, outside the casing 51. In this case, the temperature of the cooling liquid is restrained from rising due to the circulation device 52. However, the configuration of the circulation device 52 is not limited to the above.

In this embodiment, the shaft 521 and the impeller 522 are provided in plurality, in empty space within the casing 51. Specifically, the respective shafts 521 and impellers 522 are provided in four corner parts through which the image light incident on the projection device 46 does not pass, in the casing 51, which is substantially square when the inside of the casing 51 is viewed from the +Y direction.

That is, the shafts 521 and impellers 522 of two circulation devices 52, of the four circulation devices 52, are arranged at positions on both sides of the light modulation device 453B in the +Z direction, and the shafts 521 and impellers 522 of the other two circulation devices 52 are arranged at positions on both sides of the light modulation device 453R in the +Z direction. In other words, the shafts 521 and impellers 522 of two circulation devices 52, of the four circulation devices 52, are arranged at positions on both sides of the light modulation device 453G in the +X direction, and the shafts 521 and impellers 522 of the other two circulation devices 52 are arranged at positions on both sides of the light exiting surface 455E of the light combining device 455 in the +X direction. However, this configuration is not limiting. The positions and number of circulation devices 52 can be changed according to need.

Flow of Cooling Liquid

In such a cooling device 5A, when each circulation device 52 is driven, the cooling liquid in the casing 51 circulates between the inner surface of the casing 51 and the light incident-side polarizers 452, between the light incident-side polarizers 452 and the light modulation devices 453, between the light modulation devices 453 and the light exiting-side polarizers 454, and between the light exiting-side polarizers 454 and the light combining device 455, and along these components, as shown in FIG. 2.

In this case, the cooling liquid circulating along the light incident-side polarizers 452 circulates along the peripheries of the light incident-side polarizers 452. For example, the cooling liquid circulating along the light incident-side polarizer 452G for the green light LG circulates on the light incident side of the light incident-side polarizer 452G along the −X direction, then circulates to the light exiting side, and circulates on the light exiting side of the light incident-side polarizer 452G along the +X direction, which is opposite to the −X direction. The cooling liquid then circulates to the light incident side again and circulates on the light incident side of the light incident-side polarizer 452G in the −X direction.

Meanwhile, the cooling liquid circulating along the light exiting-side polarizers 454 circulates along the peripheries of the light exiting-side polarizers 454. For example, the cooling liquid circulating along the light exiting-side polarizer 454G for the green light LG circulates on the light incident side of the light exiting-side polarizer 454G along the −X direction, then circulates to the light exiting side, and circulates on the light exiting side of the light exiting-side polarizer 454G along the +X direction. The cooling liquid then circulates to the light incident side again and circulates on the light incident side of the light exiting-side polarizer 454G in the −X direction.

As the cooling liquid circulates in this way, the cooling liquid also circulates in the opposite directions on the light incident side and the light exiting side of the light modulation devices 453. For example, the cooling liquid circulating on the light incident side of the light modulation device 453G for the green light LG circulates in the +X direction along the light incident surface of the light modulation device 453G. The cooling liquid circulating on the light exiting side of the light modulation device 453G circulates in the −X direction along the light exiting surface of the light modulation device 453G.

Similarly, the cooling liquid circulating along each optical element of the light incident-side polarizer 452B, the light modulation device 453B, and the light exiting-side polarizer 454B circulates in the opposite directions on the light incident side and the light exiting side of each optical element. Similarly, the cooling liquid circulating along each optical element of the light incident-side polarizer 452R, the light modulation device 453R, and the light exiting-side polarizer 454R circulates in the opposite directions on the light incident side and the light exiting side of each optical element.

Thus, the light incident-side polarizers 452, the light modulation devices 453, and the light exiting-side polarizers 454 are cooled.

The flow velocities of the cooling liquid circulating along the respective light incident-side polarizers 452, the respective light modulation devices 453, and the respective light exiting-side polarizers 454 are substantially the same. Specifically, the flow velocity of the cooling liquid circulating along each of the light incident-side polarizers 452B, 452G, 452R is substantially the same on the light incident side and the light exiting side. Also, the flow velocity of the cooling liquid circulating along each of the light exiting-side polarizers 454B, 454G, 454R is substantially the same on the light incident side and the light exiting side. The flow velocity of the cooling liquid circulating along the light incident-side polarizers 452 is the same as the flow velocity of the cooling liquid circulating along the light exiting-side polarizers 454. Therefore, the flow velocity of the cooling liquid circulating along each of the light modulation device 453B situated between the light incident-side polarizer 452B and the light exiting-side polarizer 454B, the light modulation device 453G situated between the light incident-side polarizer 452G and the light exiting-side polarizer 454G, and the light modulation device 453R situated between the light incident-side polarizer 452R and the light exiting-side polarizer 454R is the same on the light incident side and the light exiting side.

Thus, the respective light incident-side polarizers 452, the respective light modulation devices 453, and the respective light exiting-side polarizers 454 are cooled with substantially the same cooling efficiency. However, this configuration is not limiting. For example, the flow velocity of the cooling liquid circulating on a component which tends to increase in temperature or a component which tends to deteriorate due to heat may be made higher than the flow velocity of the cooling liquid circulating on other components.

Improvement to Reduce Uneven Illuminance

A liquid changes in density with temperature change and thus changes in refractive index. Therefore, if the cooling liquid circulates in the same direction from one end side toward the other end side on the light incident side and the light exiting side of the light incident-side polarizers 452, that is, if the cooling liquid circulates in the same direction on the light incident side and the light exiting side of the light incident-side polarizers 452, the temperature of the cooling liquid rises as it goes toward the other end side and therefore the refractive index of the cooling liquid differs between the one end side and the other end side of the light incident-side polarizers 452. Such uneven refractive index distribution causes a difference between the illuminance of the light passing through the one end side of the light incident-side polarizers 452 and the illuminance of the light passing through the other end side and therefore causes uneven illuminance distribution in the luminous flux that becomes incident on the light modulation devices 453 arranged downstream on the optical path from the light incident-side polarizers 452. In this case, uneven illuminance is observed in an image projected by the projector 1 based on the light modulated by the light modulation devices 453.

However, in this embodiment, the cooling liquid on the light incident side and the light exiting side of the light incident-side polarizers 452 circulates in the opposite directions, as described above. For example, the on the light incident side of the light incident-side polarizer 452G for the green light LG, the cooling liquid circulates in the −X direction, and on the light exiting side, the cooling liquid circulates in the +X direction. Therefore, the temperature of the cooling liquid can be made substantially the same value on the +X direction side and the −X direction side of the light incident-side polarizer 452G. That is, the average value of the temperature of the cooling liquid circulating on the light incident side of a predetermined optical element and the average value of the temperature of the cooling liquid circulating on the light exiting side can be made substantially the same value. Also, the refractive index of the cooling liquid can be made substantially the same. That is, the average value of the refractive index of the cooling liquid circulating on the light incident side of a predetermined optical element and the average value of the refractive index of the cooling liquid circulating on the light exiting side can be made substantially the same value. The same applies to the other light incident-side polarizers 452B, 452R. Thus, the illuminance of the luminous flux which passes through the light incident-side polarizers 452 and becomes incident on the light modulation devices 453 can be made substantially even and the occurrence of the uneven illuminance can be restrained.

Improvement to Reduce Uneven Resolution

If the cooling liquid circulates in the same direction from one end side toward the other end side on the light incident side and the light exiting side of the light exiting-side polarizers 454, the temperature of the cooling liquid rises as it goes toward the other end side. Therefore, the refractive index of the cooling liquid differs between the one end side and the other end side of the light exiting-side polarizers 454. If such uneven refractive index distribution occurs, the back focus position of the projection device 46 changes. That is, the back focus position becomes locally inconsistent with the light modulation devices 453. If such local change (shift) in the back focus position occurs, a phenomenon such as a change of the center position of a certain pixel of an image projected by the projection device 46 or a change in the size of the pixel, that is, the uneven resolution, is observed conspicuously.

However, on the light incident side and the light exiting side of the light exiting-side polarizers 454, the cooling liquid circulates in the opposite directions to each other. For example, on the light incident side of the light exiting-side polarizer 454G for green, the cooling liquid circulates in the −X direction, and on the light exiting side, the cooling liquid circulates in the +X direction. Therefore, as in the case of the light incident-side polarizer 452G, the temperature of the cooling liquid (average value of the temperature of the cooling liquid on the light incident side and the light exiting side) can be made substantially the same value on the +X direction side and the −X direction side of the light exiting-side polarizer 454G, and the refractive index of the cooling liquid (average value of the refractive index of the cooling liquid on the light incident side and the light exiting side) can be made substantially the same value. The same applies to the other light exiting-side polarizers 454B, 454R. Thus, the local change of the back focus position can be restrained and the conspicuous occurrence of the uneven resolution in the projected image can be restrained.

Figure 3:
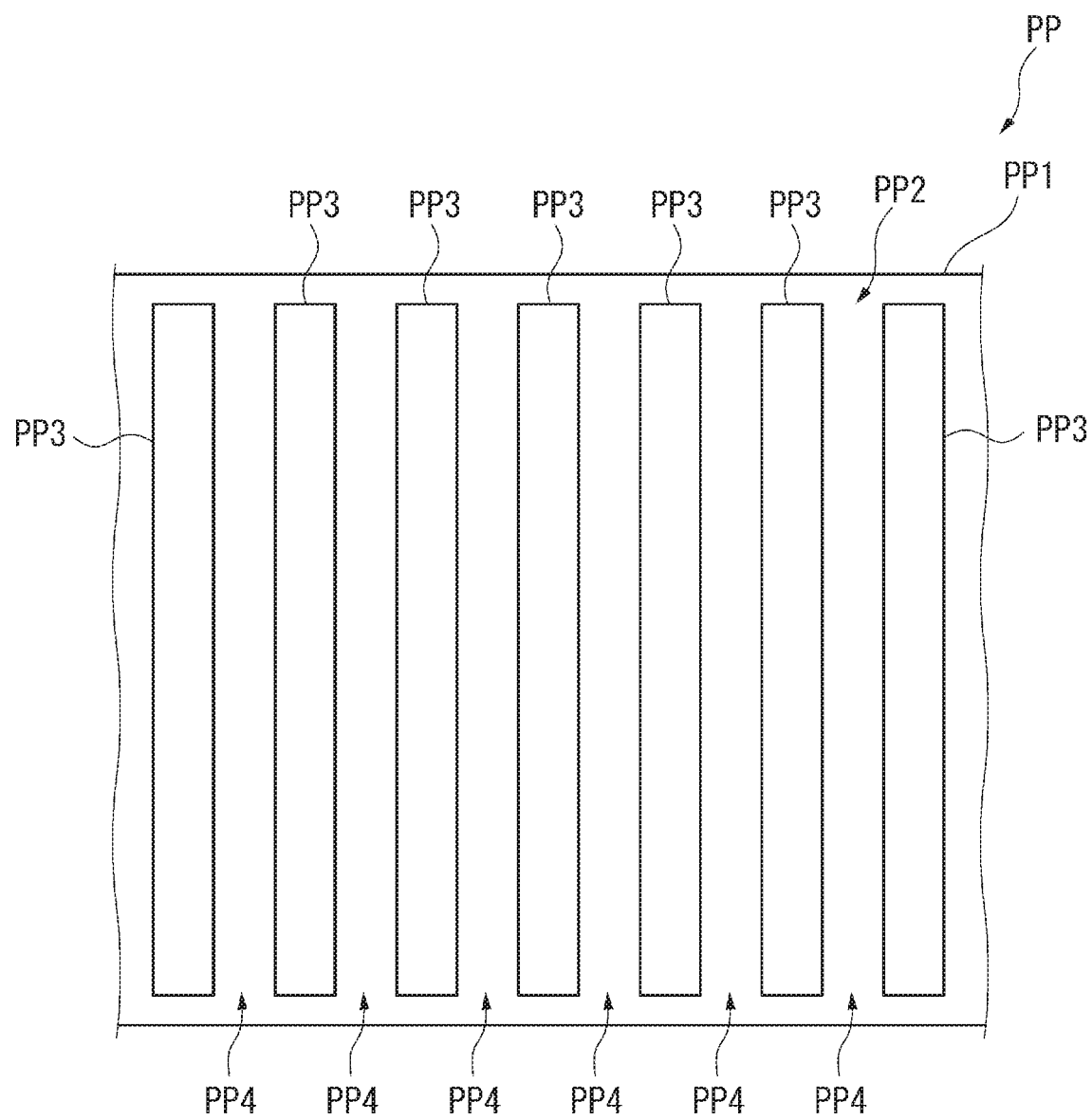
FIG. 3 is a schematic view showing the configuration of a polarization element in the first embodiment.
Figure 3:
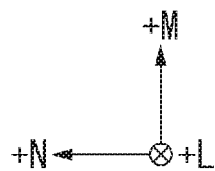
Figure 4:
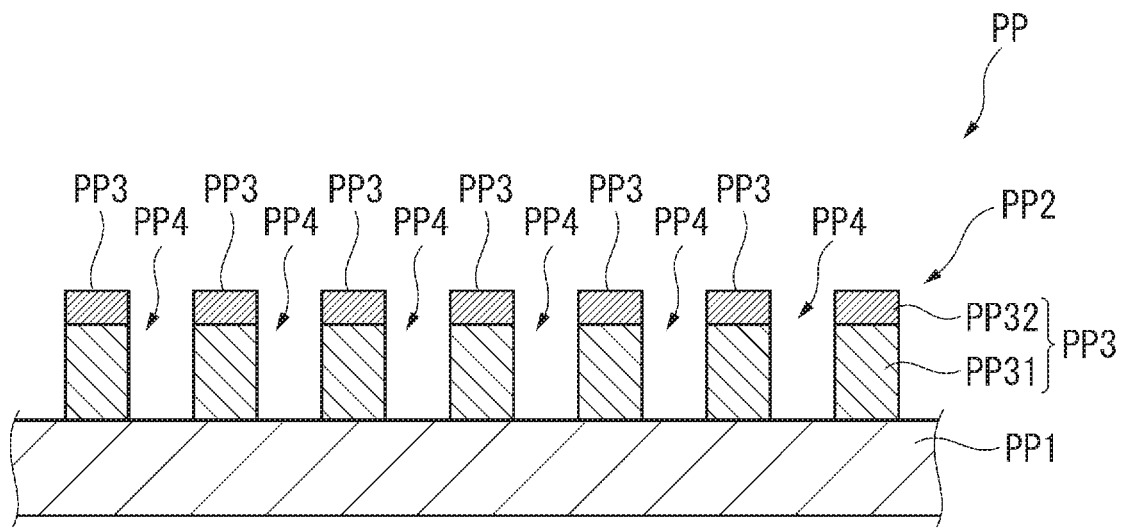
FIG. 4 is a cross-sectional view showing the configuration of the polarization element in the first embodiment.
Figure 4:
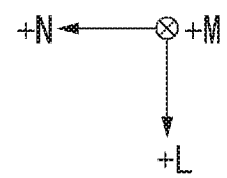

Direction of Polarizer in Relation to Direction of Circulation of Cooling Liquid FIGS. 3 and 4 are schematic views showing the configuration of the polarization element PP. Specifically, FIG. 3 is a schematic view showing the polarization element PP as viewed from the light incident side. FIG. 4 schematically shows a cross section taken along the transmission axis of the polarization element PP.

In this embodiment, the polarization element PP shown in FIGS. 3 and 4 is employed as the light incident-side polarizers 452 and the light exiting-side polarizers 454. The polarization element PP is a wire grid inorganic polarizer made up of a light-transmissive substrate PP1 which transmits light and a recessed/protruding structure PP2 formed thereon.

Of these, the recessed/protruding structure PP2 has a plurality of protruding parts PP3 extending along a +M direction and arranged in a +N direction on the light incident surface, where the traveling direction of the light transmitted through the polarization element PP is a +L direction and the +M direction and the +N direction intersect the +L direction and intersect each other. The recessed/protruding structure PP2 also has a groove part PP4 between the plurality of protruding parts PP3.

Each protruding part PP3 includes a grid layer PP31 made up of an inorganic polarization material containing aluminum stacked by vapor deposition or the like on the light-transmissive substrate PP1, and an absorption layer PP32 of silicon or the like applied on the grid layer PP31, as shown in FIG. 4.

The transmission axis of such a polarization element PP is an axis along the direction of arrangement of the protruding parts PP3, that is, along the +N direction.

When the cooling liquid circulates along such a polarization element PP, the cooling efficiency for the polarization element PP drops, depending on the direction of circulation of the cooling liquid in relation to the recessed/protruding structure PP2.

Specifically, if the cooling liquid circulates in the +N direction, which is the direction of arrangement of the protruding parts PP3, or in the −N direction (not illustrated) opposite to the +N direction, the velocity boundary layer becomes thicker due to the protruding parts PP3 and the cooling efficiency for the polarization element PP drops.

Meanwhile, if the cooling liquid circulates along the +M direction, which is the direction of extension (longitudinal direction) of the protruding parts PP3 and the groove parts PP4, or the −M direction (not illustrated) opposite to the +M direction, the velocity boundary layer becomes thinner and the cooling efficiency for the polarization element PP becomes higher than the above. Particularly, the viscosity of the fluorine-based inert liquid described as an example above is higher than that of gas and lower than that of water. Also, the surface tension of the inert liquid is higher than that of water. Therefore, circulating the cooling liquid made up of the inert liquid along the +M direction or the −M direction can increase the cooling efficiency for the polarization element PP by the cooling liquid.

Figure 5:
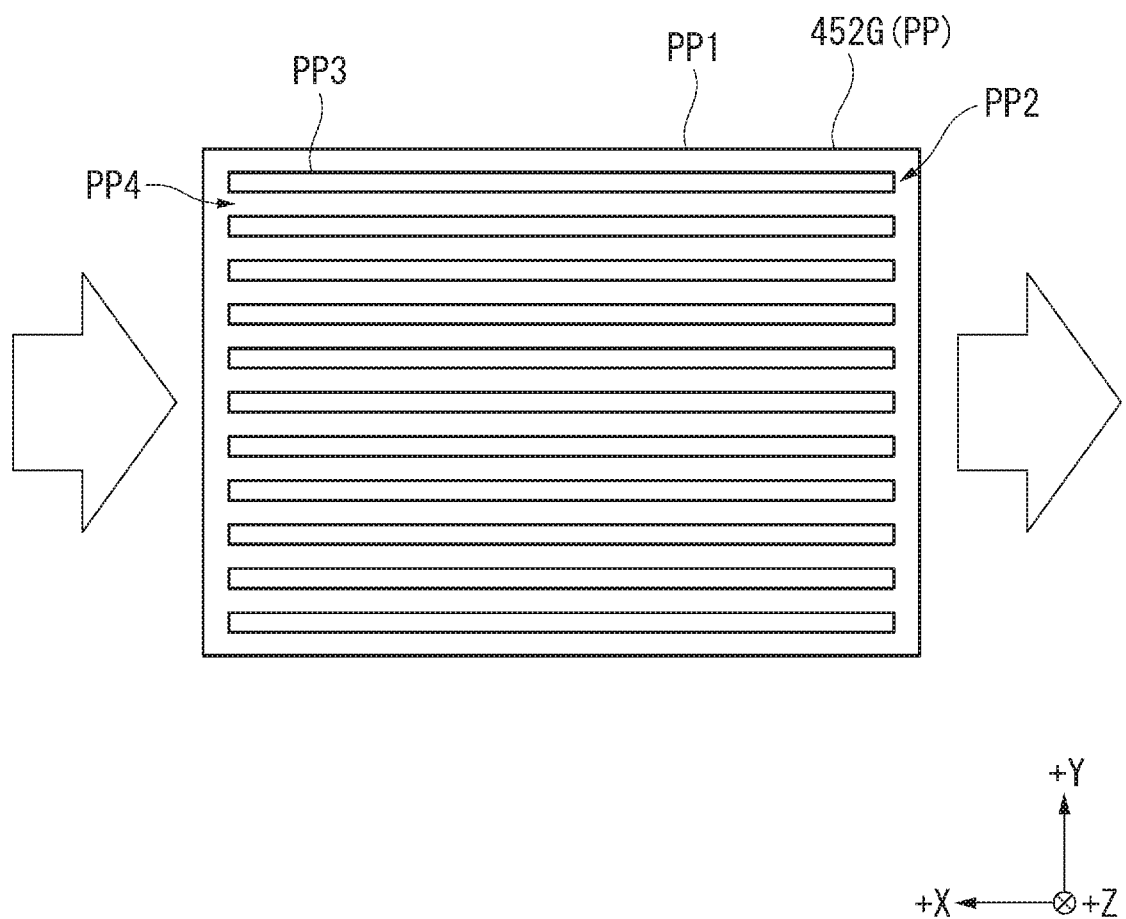
FIG. 5 shows the direction of circulation of a cooling liquid in the first embodiment.

FIG. 5 shows the direction of extension of the protruding parts PP3 and the groove parts PP4 of the light incident-side polarizer 452G and the direction of circulation the cooling liquid. In FIG. 5, only a part of the plurality of protruding parts PP3 and the plurality of groove parts PP4 provided in the light incident-side polarizer 452G is denoted by the reference signs.

In the cooling device 5A, the cooling liquid circulates along the −X direction on the light incident side of the light incident-side polarizer 452G for the green light LG, of the light incident-side polarizers 452 employing the polarization element PP, and circulates along the +X direction on the light exiting side of the light incident-side polarizer 452G. Therefore, arranging the light incident-side polarizer 452G in such a way that the direction of extension of the protruding parts PP3 and the groove parts PP4 is along the +X direction, as shown in FIG. 5, allows the velocity boundary layer to be thinner and enables efficient cooling of the light incident-side polarizer 452G with the cooling liquid.

Similarly, arranging the other light incident-side polarizers 452B, 452R in such a way that the direction of extension of the protruding parts PP3 and the groove parts PP4 is along the direction of circulation of the cooling liquid, enables efficient cooling of the light incident-side polarizers 452B, 452R.

In the cooling device 5A, the cooling liquid circulates along the −X direction on the light incident side of the light exiting-side polarizer 454G for the green light LG, of the light exiting-side polarizers 454 employing the polarization element PP, and circulates along the +X direction on the light exiting side of the light exiting-side polarizer 454G. Therefore, as in the case of the light incident-side polarizer 452G, arranging the light exiting-side polarizer 454G in such a way that the direction of extension of the protruding parts PP3 and the groove parts PP4 is along the +X direction, enables efficient cooling of the light exiting-side polarizer 454G with the cooling liquid.

Similarly, arranging the other light exiting-side polarizers 454B, 454R in such a way that the direction of extension of the protruding parts PP3 and the groove parts PP4 is along the direction of circulation of the cooling liquid, enables efficient cooling of the light exiting-side polarizers 454B, 454R.

The recessed/protruding structure PP2 having the plurality of protruding parts PP3 and the plurality of groove parts PP4 is described as being formed on the light incident surface of the wire grid polarization element PP. However, the recessed/protruding structure PP2 is not limited to this configuration and may be formed on the light exiting surface of the polarization element PP. When the cooling liquid circulates in the opposite directions along the direction of extension of the protruding parts PP3 and the groove parts PP4 on the light incident side and the light exiting side of the light incident-side polarizers 452, the cooling liquid circulates along the direction of extension whether the recessed/protruding structure PP2 is situated on the light incident side or the light exiting side of the light incident-side polarizers 452. The same applies to the light exiting-side polarizers 454.

Therefore, whether the recessed/protruding structure PP2 is situated on the light incident side or the light exiting side, the light incident-side polarizers 452 and the light exiting-side polarizers 454 can be efficiently cooled.

Effects of First Embodiment

The projector 1 according to the embodiment described above can achieve the following effects.

For example, the cooling liquid in the casing 51 circulates on the light incident side of the light incident-side polarizer 452G, along the −X direction (an example of the first direction), which is a direction intersecting the traveling direction of the green light LG passing through the light incident-side polarizer 452G. The cooling liquid circulates on the light exiting side of the light incident-side polarizer 452G, along the +X direction (an example of the second direction) opposite to the −X direction. Thus, the temperature distribution of the cooling liquid circulating on the light incident side of the light incident-side polarizer 452G and the temperature distribution of the cooling liquid circulating on the light exiting side can complement each other. That is, the temperature distribution of the cooling liquid which circulates on the light incident side and the light exiting side of the light incident-side polarizer 452G and through which the green light LG passes can be made substantially even. Therefore, the green light LG can be regarded as the light passing through the cooling liquid having substantially even refractive index distribution. Thus, the illuminance distribution of the green light LG incident on the light modulation device 453G can be made substantially even. This can restrain the occurrence of uneven illuminance in an image formed by the light modulation devices 453 and hence in an image projected by the projector 1. The same applies to the other light incident-side polarizers 452B, 452R.

Thus, the occurrence of uneven illuminance in an image projected and displayed by the projection device 46 can be restrained and deterioration of the image can be restrained.

For example, the cooling liquid in the casing 51 circulates on the light incident side of the light exiting-side polarizer 454G, along the −X direction (an example of the first direction), which is a direction intersecting the traveling direction of the green light LG passing through the light exiting-side polarizer 454G. The cooling liquid circulates on the light exiting side of the light exiting-side polarizer 454G, along the +X direction (an example of the second direction) opposite to the −X direction. Thus, the temperature distribution of the cooling liquid circulating on the light incident side of the light exiting-side polarizer 454G and the temperature distribution of the cooling liquid circulating on the light exiting side can complement each other. That is, the temperature distribution of the cooling liquid which circulates on the light incident side and the light exiting side of the light exiting-side polarizer 454G and through which the green light LG passes can be made substantially even. Therefore, the green light LG can be regarded as the light passing through the cooling liquid having substantially even refractive index distribution. Thus, local change of the back focus position of the projection device 46 can be restrained. Therefore, of a red image formed by the red light LR, a green image formed by the green light LG and a blue image formed by the blue light LB forming the projected image, the green image can be restrained from having conspicuously uneven resolution. The same applies to the other light exiting-side polarizers 454B, 454R.

Thus, the occurrence of uneven resolution in an image projected and displayed by the projection device 46 can be restrained and deterioration of the image can be restrained.

On each light incident-side polarizer 452, the flow velocity of the cooling liquid circulating on the light incident side and the flow velocity of the cooling liquid circulating on the light exiting side are substantially the same. Also, on each light exiting-side polarizer 454, the flow velocity of the cooling liquid circulating on the light incident side and the flow velocity of the cooling liquid circulating on the light exiting side are substantially the same. Thus, the light incident side and the light exiting side of the light incident-side polarizers 452 can be cooled substantially evenly. Also, the light incident side and the light exiting side of the light exiting-side polarizers 454 can be cooled substantially evenly. Moreover, the temperature distribution of the cooling liquid circulating on the light incident side of the light incident-side polarizers 452 and the temperature distribution of the cooling liquid circulating on the light exiting side can be made coincident with each other. Also, the refractive index distribution of the cooling liquid circulating on the light incident side of the light incident-side polarizers 452 and the refractive index distribution of the cooling liquid circulating on the light exiting side can be made coincident with each other. Therefore, the refractive index distribution of the cooling liquid can be made even between the light incident side and the light exiting side of the light incident-side polarizers 452. The same applies to the light exiting-side polarizers 454. Thus, deterioration of a projected image can be restrained more effectively.

The projector 1 has the plurality of light modulation devices 453B, 453G, 453R corresponding to the plurality of color lights including the green light LG, and the light combining device 455, which combines the color lights modulated by the plurality of light modulation devices respectively. The polarization element PP forms the light exiting-side polarizer 454G situated to the light exiting side of the light modulation device 453G corresponding to the green light LG.

Thus, the light exiting-side polarizer 454G, on which the green light LG having a greater amount of light than the blue light LB and the red light LR becomes incident and therefore tends to have a relatively high temperature, can be cooled effectively. This enables a longer life of the projector 1.

The polarization element PP, employed for the light incident-side polarizers 452 and the light exiting-side polarizers 454, has the recessed/protruding structure PP2 on one surface of the light incident surface and the light exiting surface of the light-transmissive substrate PP1. The recessed/protruding structure PP2 has the plurality of protruding parts PP3 (plurality of protrusions) each extending along the +M direction (predetermined direction) and arranged along the +N direction (direction intersecting the predetermined direction), and the plurality of groove parts PP4 each being formed between the plurality of protruding parts PP3. The light incident-side polarizers 452 and the light exiting-side polarizers 454 are arranged in such a way that the direction of extension of the plurality of protruding parts PP3 is along the direction of circulation of the cooling liquid circulating along the one surface. In other words, the light incident-side polarizers 452 and the light exiting-side polarizers 454 have the plurality of protruding parts PP3 extending along the direction of circulation of the cooling liquid and arranged in the direction intersecting the direction of circulation. This configuration can make the velocity boundary layer thinner and can increase the cooling efficiency for the polarizers 452, 454. Thus, the polarizers 452, 454 can be effectively cooled.

The cooling liquid filling the inside of the casing 51 is a fluorine-based inert liquid. Thus, the light modulation devices 453, which are electronic components, can operate in the state of being immersed in the cooling liquid. This enables the light modulation devices 453 to operate stable while being cooled, and thus enables the projector 1 to operate stable.

Modification of First Embodiment

In the cooling device 5A of the projector 1, the cooling liquid circulated by the circulation devices 52 circulate counterclockwise around the respective light incident-side polarizers 452 and the respective light exiting-side polarizer 454, when these polarizers 452, 454 are viewed from the +Y direction. However, the cooling device is not limited to this and may be configured in such a way that the cooling liquid circulates clockwise around the polarizers 452, 454, as viewed from the +Y direction. The cooling device may also be configured in such a way that the cooling liquid circulates in one direction of the +Y direction and the −Y direction on the light incident side of the polarizers 452, 454 and circulates in the other direction on the light exiting side.

In the description below, parts that are the same or substantially the same as those already described are denoted by the same reference signs and are not described further in detail.

Figure 6:
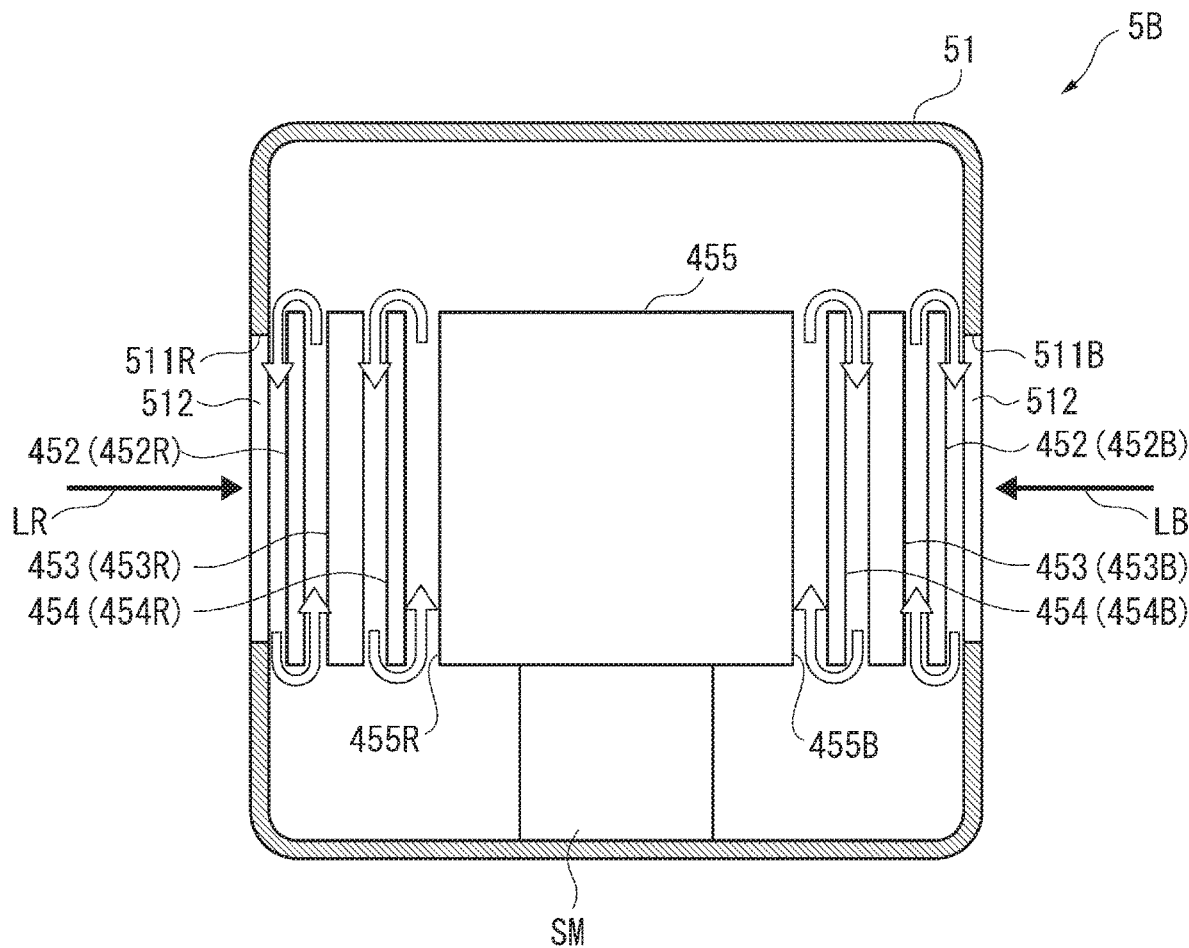
FIG. 6 is a schematic view showing a modification of the cooling device in the first embodiment.

FIG. 6 is a schematic view showing a cooling device 5B as a modification of the cooling device 5A. Specifically, FIG. 6 schematically shows a cross section of the cooling device 5B taken along an XY plane. In FIG. 6, a support part SM arranged inside the casing 51 and supporting the light combining device 455 is illustrated.

For example, similarly to the cooling device 5A, the cooling device 5B shown in FIG. 6 has the casing 51, in which the image forming unit FU is arranged and whose inside is filled with the cooling liquid, and the circulation device 52, which stirs and circulates the cooling liquid in the casing 51.

In the cooling device 5B, the cooling liquid circulating along the light incident-side polarizers 452 (with the light incident-side polarizer 452G not being illustrated) circulates in the −Y direction on the light incident side of the light incident-side polarizers 452, the circulates in the +Y direction on the light exiting side, and thus circulates around the light incident-side polarizers 452.

The cooling liquid circulating along the light exiting-side polarizers 454 (with the light exiting-side polarizer 454G not being illustrated) circulates in the −Y direction on the light incident side of the light exiting-side polarizers 454, then circulates in the +Y direction on the light exiting side, and thus circulates around the light exiting-side polarizers 454.

Figure 7:
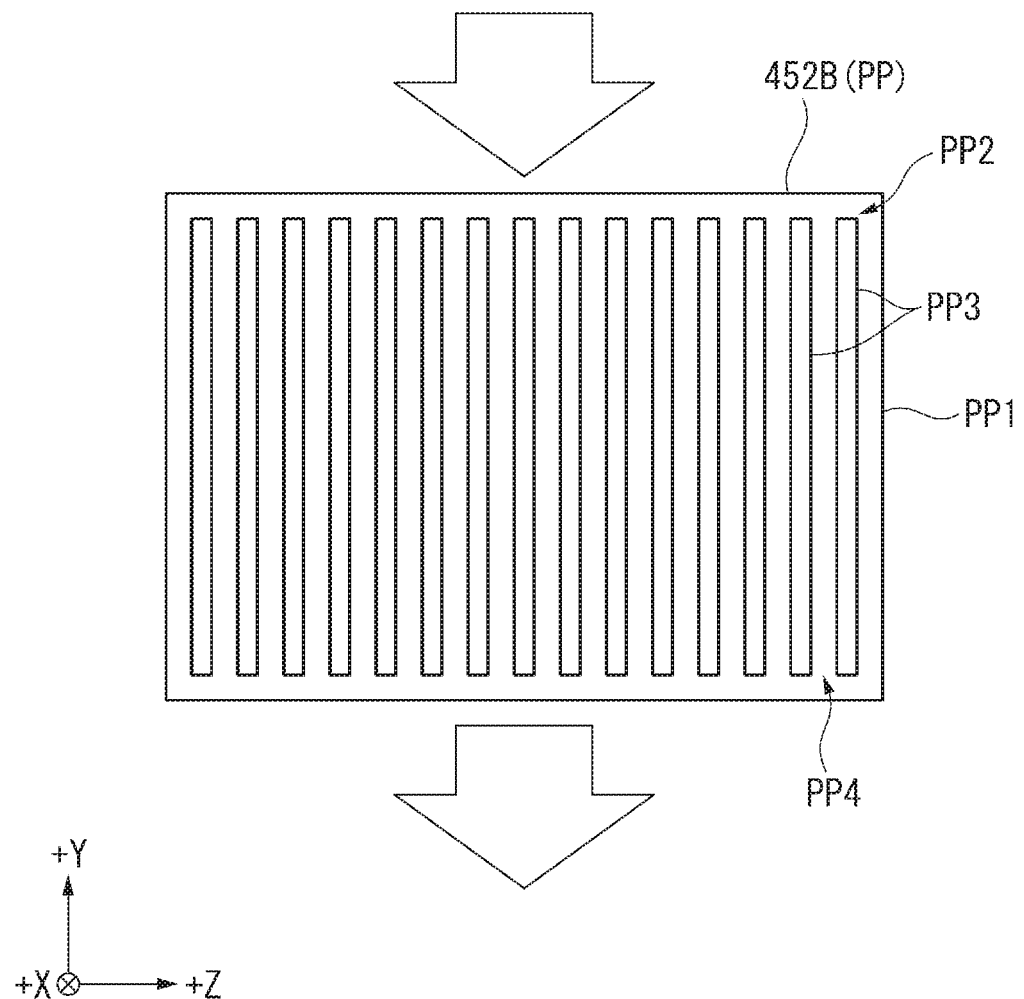
FIG. 7 shows the direction of circulation of the cooling liquid in the modification of the cooling device in the first embodiment.

FIG. 7 shows the direction of extension of the protruding parts PP3 and the groove parts PP4 on the light incident-side polarizer 452B and the direction of circulation of the cooling liquid in the cooling device 5B. In FIG. 7, only a part of the plurality of protruding parts PP3 and the plurality of groove parts PP4 on the light incident-side polarizer 452B is denoted by reference signs.

In the cooling device 5B, too, the light incident-side polarizers 452 are arranged in such a way that the direction of extension of the respective protruding parts PP3 and the respective groove parts PP4 is along the direction of circulation of the cooling liquid.

For example, if the recessed/protruding structure PP2 of the light incident-side polarizer 452B is situated on the light incident side, the light incident-side polarizer 452B is arranged in such a way that the direction of extension of the protruding parts PP3 and the groove parts PP4 is along the −Y direction, which is the direction of circulation of the cooling liquid. The same applies to the other light incident-side polarizers 452G, 452R and the respective light exiting-side polarizers 454. Thus, the velocity boundary layer can be made thinner and the light incident-side polarizers 452 and the light exiting-side polarizers 454 can be cooled efficiently.

Also, the polarizers 452, 454 can be cooled equally efficiently, even if the recessed/protruding structure PP2 is situated on the light exiting side of the respective polarizers 452, 454, or even if the cooling liquid circulates in the +Y direction on the light incident side of the respective polarizers 452, 454 and circulates in the −Y direction on the light exiting side.

Thus, a projector having such a cooling device 5B can achieve effects similar to those of the projector 1 having the cooling device 5A.

Also, the cooling devices 5A, 5B are not limited to the configuration in which the cooling liquid circulates around the respective polarizers 452, 454. For example, the cooling liquid need not circulate around the polarizers 452, 454, provided that the cooling liquid circulating along the light incident-side polarizers 452 circulates in the opposite directions on the light incident side and the light exiting side of the light incident-side polarizers 452 and that the cooling liquid circulating along the light exiting-side polarizers 454 circulates in the opposite directions on the light incident side and the light exiting side of the light exiting-side polarizers 454.

Second Embodiment

Next, a second embodiment of the invention will be described.

A projector according to this embodiment has a configuration similar to that of the projector 1 but differs from the projector 1 in having a demarcation member which divides the space in the casing of the cooling device. In the description below, parts that are the same or substantially the same as those already described are denoted by the same reference signs and are not described further in detail.

Figure 8:
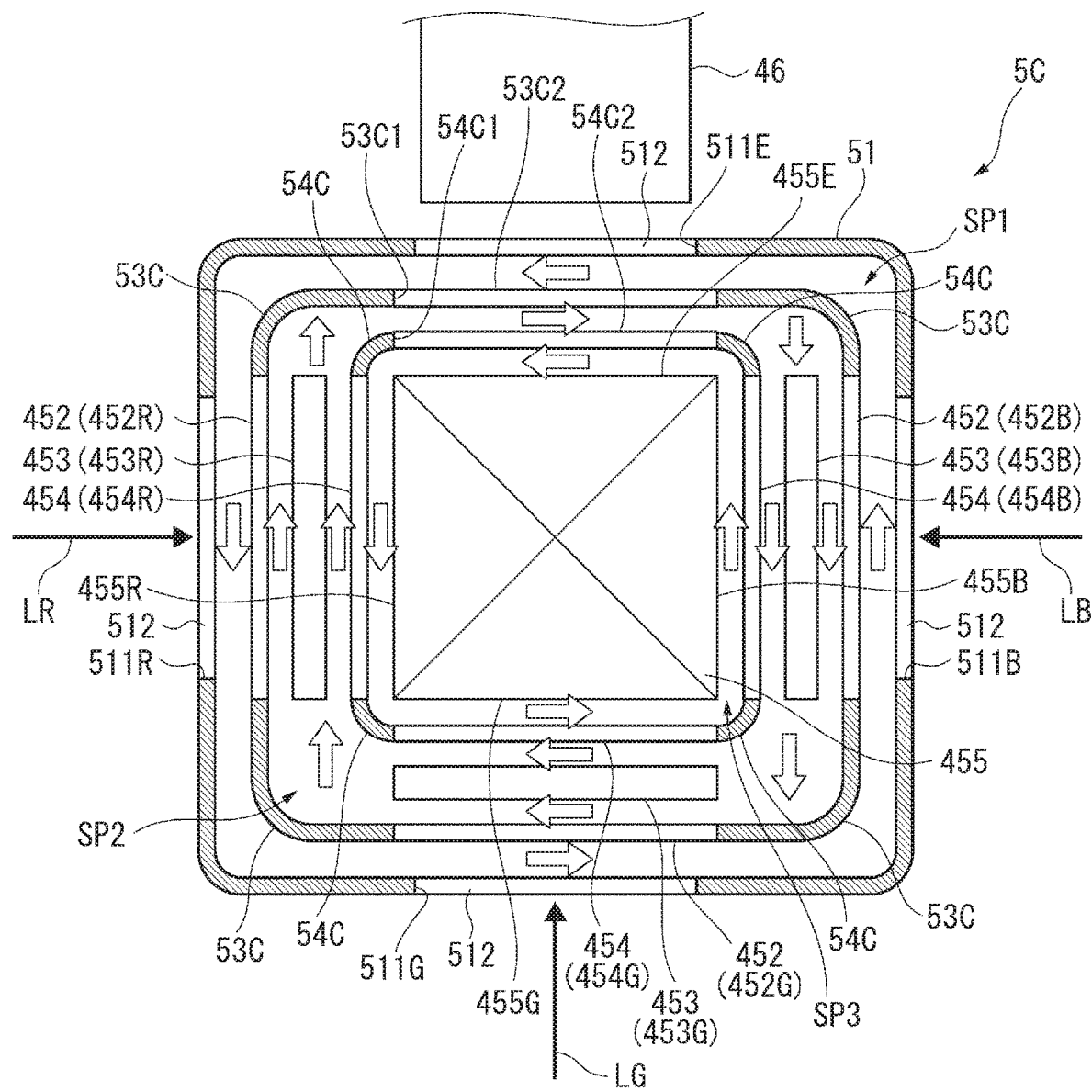
FIG. 8 is a schematic view showing a cooling device of a projector according to a second embodiment of the invention.

FIG. 8 is a schematic view showing a cooling device 5C provided in the projector according to this embodiment. Specifically, FIG. 8 schematically shows a cross section of the cooling device 5C taken along an XZ plane.

The projector according to this embodiment has components and functions similar to those of the projector 1, except for having the cooling device 5C instead of the cooling device 5A.

The cooling device 5C has the casing 51 and the circulation device 52 and also has demarcation members 53C, 54C as shown in FIG. 8.

The demarcation members 53C, 54C are provided inside the casing 51 and divide the space in the casing 51. Specifically, the demarcation member 53C connects the respective light incident-side polarizers 452 of the image forming unit FU arranged in the casing 51, in the +X direction and the +Z direction, and demarcates a space SP1 on the light incident side of the light incident-side polarizers 452 and a space on the light exiting side.

Such a demarcation member 53C has an opening 53C1 through which image light passes, at a site facing the light exiting surface 455E of the light combining device 455. The opening 53C1 is closed by a light-transmissive member 53C2 through which the image light can pass.

The demarcation member 54C connects the respective light exiting-side polarizers 454 of the image forming unit FU arranged in the casing 51, in the +X direction and the +Z direction, and demarcates a space SP2 on the light incident side of the light exiting-side polarizers 454 and a space SP3 on the light exiting side. That is, the demarcation member 54C divides the space on the light exiting side of the light incident-side polarizers 452 into the space SP2 and the space SP3.

Such a demarcation member 54C, too, has an opening 54C1 through which image light passes, at a site facing the light exiting surface 455E. The opening 54C1 is closed by a light-transmissive member 54C2.

The space in the casing 51 is divided by the demarcation members 53C, 54C into the space SP1 on the light incident side of the light incident-side polarizers 452, the space SP2 on the light exiting side of the light incident-side polarizers 452 and on the light incident side of the light exiting-side polarizers 454, and the space SP3 on the light exiting side of the light exiting-side polarizers 454.

Although not illustrated, a space where the cooling liquid can circulate is formed to the +Y direction side and the −Y direction side of demarcation members 53C, 54C. Therefore, the cooling liquid can circulate between the spaces SP1 to SP3. That is, the spaces SP1, SP2, SP3 are demarcated by the demarcation members 53C, 54C in such a way that the cooling liquid can circulate between the respective spaces. Inside each of the spaces SP1 to SP3, the circulation device 52 (shaft 521 and impeller 522) is provided and stirs and circulates the cooling liquid in the spaces SP1 to SP3.

In such a cooling device 5C, when the circulation device 52 in the space SP1 is driven, the cooling liquid in the space SP1 circulates counterclockwise where the casing 51 is viewed from the +Y direction so that the opening 511E comes to the upper side in FIG. 8. The cooling liquid circulating in this way circulates between the inner surface of the casing 51 and the light incident-side polarizers 452 and cools the light incident-side surfaces of the light incident-side polarizers 452. For example, the cooling liquid circulates along the −X direction on the light incident side of the light incident-side polarizer 452G and cools the light incident surface of the light incident-side polarizer 452G. As the heated cooling liquid comes into contact with the inner surface of the casing 51, a part of the heat of the cooling liquid is transmitted to the casing 51 and radiated outside by the casing 51. The cooling liquid is thus cooled.

When the circulation device 52 in the space SP2 is driven, the cooling liquid in the space SP2 circulates clockwise where the casing 51 is viewed from the +Y direction in FIG. 8. The cooling liquid circulating in this way circulates between the light incident-side polarizers 452 and the light modulation device 453 and between the light modulation devices 453 and the light exiting-side polarizers 454 and cools the light exiting surfaces of the respective light incident-side polarizers 452, the light incident surfaces and the light exiting surfaces of the respective light modulation devices 453, and the light incident surfaces of the respective light exiting-side polarizers 454. For example, the cooling liquid circulates between the light incident-side polarizer 452G and the light modulation device 453G and between the light modulation device 453G and the light exiting-side polarizer 454G along the +X direction and cools these components.

When the circulation device 52 in the space SP3 is driven, the cooling liquid in the space SP3 circulates counterclockwise where the casing 51 is viewed from the +Y direction in FIG. 8. The cooling liquid circulating in this way circulates between the light exiting-side polarizers 454 and the light combining device 455 and cools the light exiting surfaces of the light exiting-side polarizers 454. For example, the cooling liquid circulates between the light exiting-side polarizer 454 and the light combining device 455 (light incident surface 455G) along the −X direction and cools these components.

In this way, the cooling liquid in the casing 51 circulates in the same direction along the respective light modulation devices 453, on the light incident side and the light exiting side of the respective light modulation devices 453. Also, the cooling liquid circulates in the opposite directions along the respective light incident-side polarizers 452, on the light incident side and the light exiting side of the respective light incident-side polarizers 452. The cooling liquid circulates in the opposite directions along the respective light exiting-side polarizers 454, on the light incident side and the light exiting side of the respective light exiting-side polarizers 454. Although a detailed illustration is not given, the direction of extension of the protruding parts PP3 and the groove parts PP4 of the respective polarizers 452, 454 is along the direction of circulation of the cooling liquid.

Therefore, as with the cooling device 5A, the occurrence of the uneven illuminance and the uneven resolution can be restrained and the respective polarizers 452, 454 can be cooled efficiently.

In this embodiment, the flow velocities of the cooling liquid circulating in the spaces SP1 to SP3 are substantially the same. However, this is not limiting. For example, the flow velocities of the cooling liquid circulating in the spaces SP2, SP3 may be made higher than the flow velocity of the cooling liquid circulating in the space SP1, thus actively cooling the light exiting-side polarizers 454.

The projector having the cooling device 5C can achieve effects similar to those of the projector 1.

Modification of Second Embodiment

In the cooling device 5C, the cooling liquid circulating along the light modulation devices 453 circulates in the same direction on the light incident side and the light exiting side. However, this is not limiting. The cooling liquid may circulate in the opposite directions on the light incident side and the light exiting side of the light modulation devices 453. In this case, a demarcation member that connects the respective light modulation devices 453 may be additionally provided.

As a configuration to reduce one of the uneven illuminance and the uneven resolution and improve the illuminance or resolution, one of the demarcation members 53C, 54C may be provided inside the casing 51 so that the cooling liquid circulates in the opposite directions on the light incident side and the light exiting side of the target polarizers.

Figure 9:
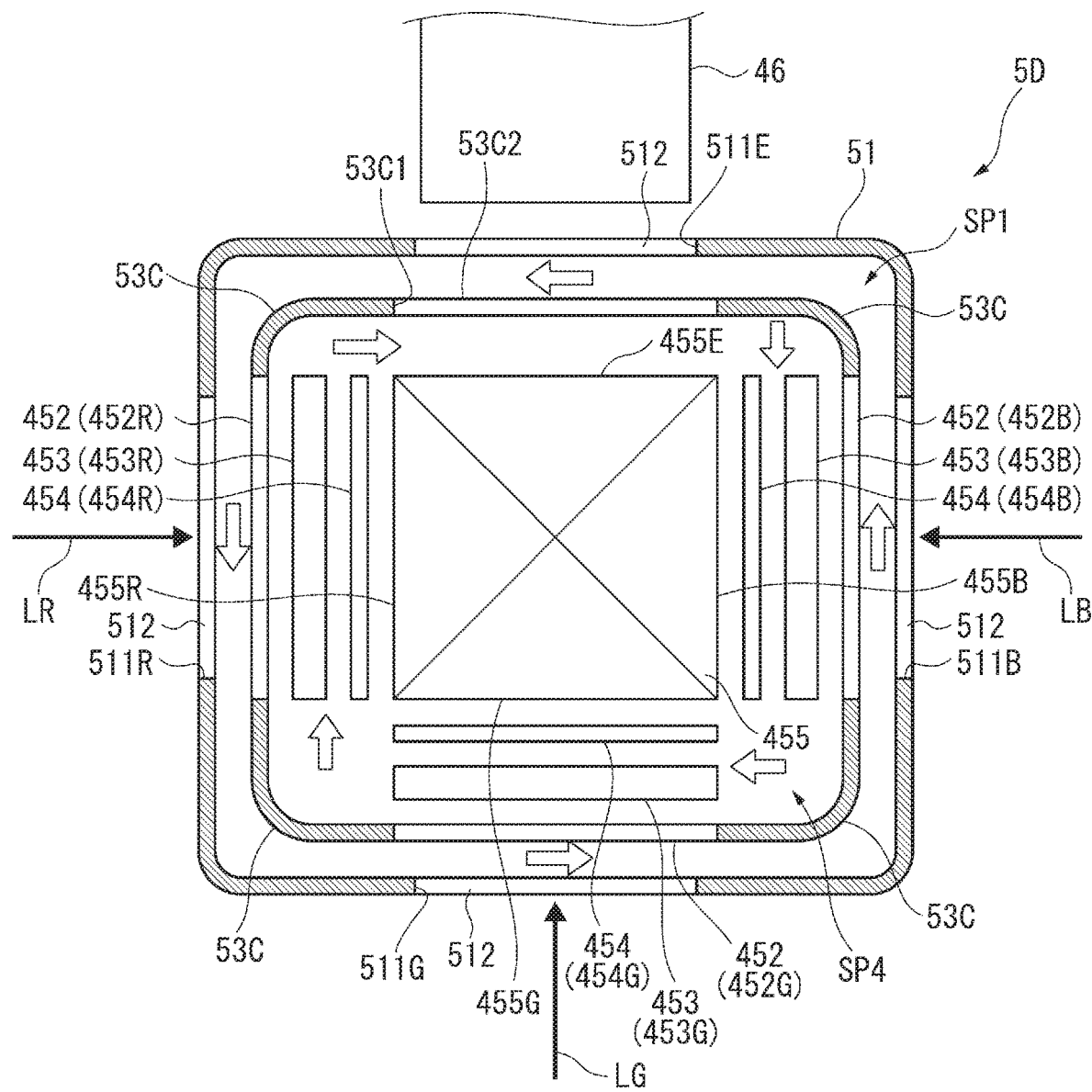
FIG. 9 is a schematic view showing a modification of the cooling device in the second embodiment.

FIG. 9 is a schematic view showing a cooling device 5D as a modification of the cooling device 5C. Specifically, FIG. 9 schematically shows a cross section of the cooling device 5D taken along an XZ plane.

For example, the cooling device 5D shown in FIG. 9 has a configuration similar to that of the cooling device 5C but does not have the demarcation member 54C. Therefore, the demarcation member 53C divides the space in the casing 51 into a space SP1 on the light incident side of the light incident-side polarizers 452 and a space SP4 on the light exiting side.

In such a cooling device 5D, when the circulation device 52 in the space SP1 is driven, the cooling liquid circulates counterclockwise in the space SP1 as viewed from the +Y direction. When the circulation device 52 in the space SP4 is driven, the cooling liquid circulates clockwise in the space SP4 as viewed from the +Y direction.

Therefore, the direction of circulation of the cooling liquid circulating on the light incident side of the respective light incident-side polarizers 452 and the direction of circulation of the cooling liquid circulating on the light exiting side of the respective light incident-side polarizers 452 are opposite to each other. The directions of circulation of the cooling liquid may be other directions, provided that the cooling liquid circulates in the opposite directions on the light incident side and the light exiting side of the light incident-side polarizers 452. The respective light modulation devices 453 and the respective light exiting-side polarizers 454 are cooled by the cooling liquid circulating in the same direction on the light incident side and the light exiting side of the respective components.

Such a cooling device 5D, too, can restrain the conspicuous occurrence of the uneven illuminance in a projected image and thus can restrain deterioration of the image.

Figure 10:
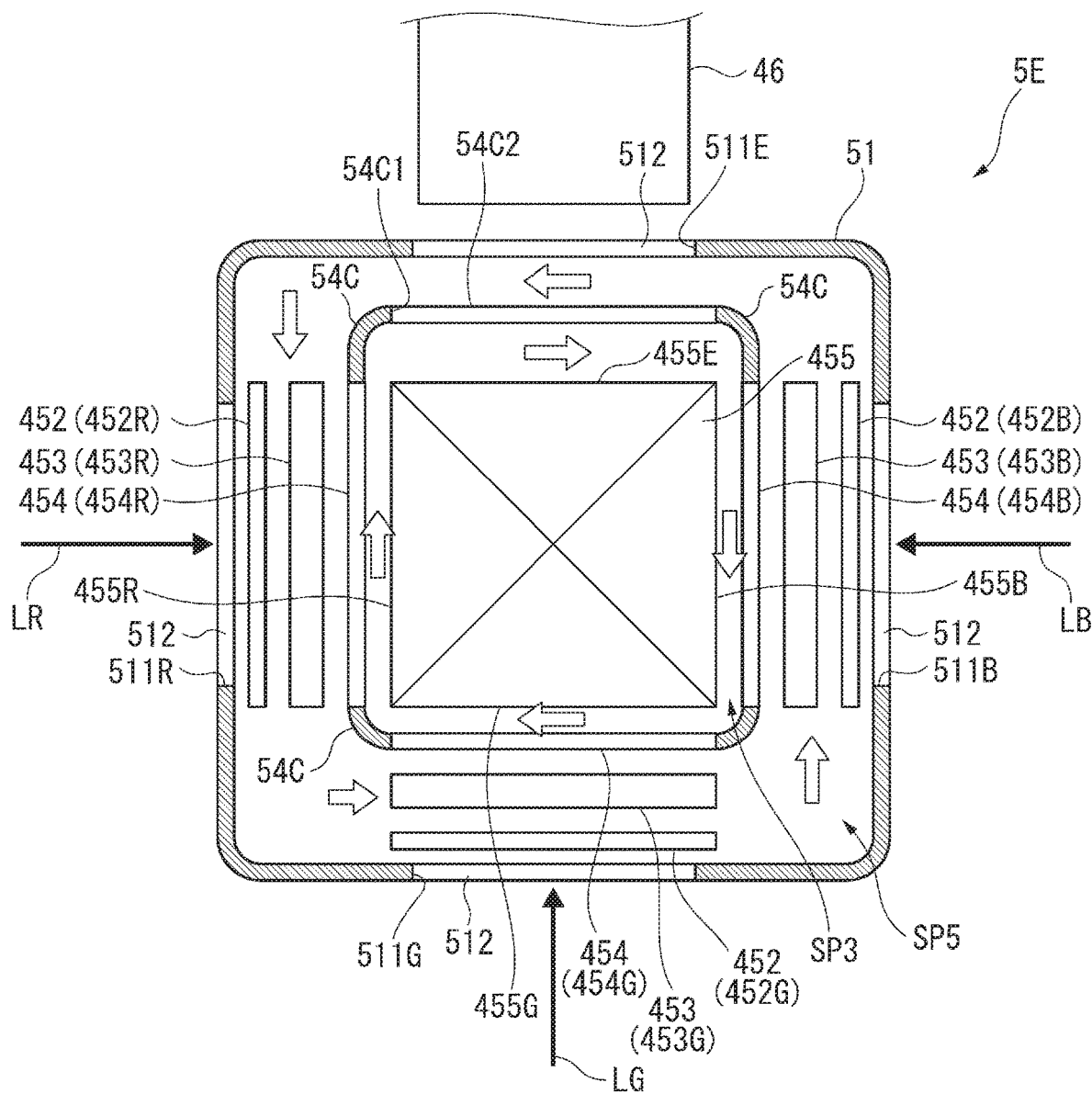
FIG. 10 is a schematic view showing a modification of the cooling device in the second embodiment.

FIG. 10 is a schematic view showing a cooling device 5E as a modification of the cooling device 5C. Specifically, FIG. 10 schematically shows a cross section of the cooling device 5E taken along an XZ plane.

For example, the cooling device 5E shown in FIG. 10 has a configuration similar to that of the cooling device 5C but does not have the demarcation member 53C. Therefore, the demarcation member 54C divides the space in the casing 51 into a space SP5 on the light incident side of the light exiting-side polarizers 454 and a space SP3 on the light exiting side.

In such a cooling device 5E, when the circulation device 52 in the space SP5 is driven, the cooling liquid circulates counterclockwise in the space SP5 as viewed from the +Y direction. When the circulation device 52 in the space SP3 is driven, the cooling liquid circulates clockwise in the space SP3 as viewed from the +Y direction.

Therefore, the direction of circulation of the cooling liquid circulating on the light incident side of the respective light exiting-side polarizers 454 and the direction of circulation of the cooling liquid circulating on the light exiting side of the respective light exiting-side polarizers 454 are opposite to each other. The directions of circulation of the cooling liquid may be other directions, provided that the cooling liquid circulates in the opposite directions on the light incident side and the light exiting side of the light exiting-side polarizers 454. The respective light incident-side polarizers 452 and the respective light modulation devices 453 are cooled by the cooling liquid circulating in the same direction on the light incident side and the light exiting side of the respective components.

Such a cooling device 5E, too, can restrain the conspicuous occurrence of the uneven resolution in a projected image and thus can restrain deterioration of the image.

Third Embodiment

Next, a third embodiment of the invention will be described.

A projector according to this embodiment has a configuration similar to that of the projector 1. However, in the cooling device provided in the projector according to this embodiment, the circulation of the cooling liquid between the light combining device 455 and the projection device 46 is regulated. In this respect, the projector according to this embodiment differs from the projector 1. In the description below, parts that are the same or substantially the same as those already described are denoted by the same reference signs and are not described further in detail.

Figure 11:
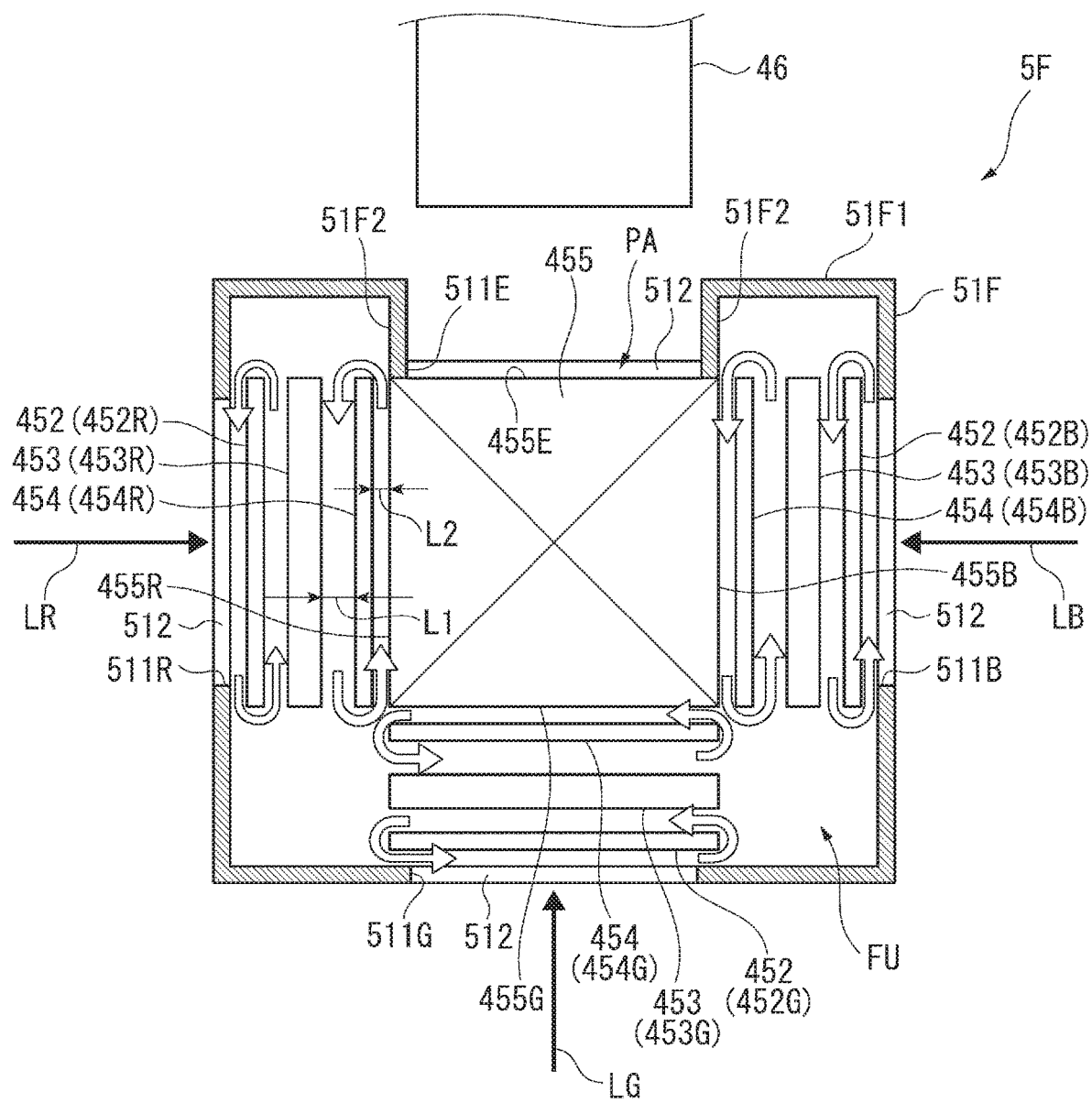
FIG. 11 is a schematic view showing a cooling device of a projector according to a third embodiment of the invention.

FIG. 11 is a schematic view showing a cooling device 5F provided in the projector according to this embodiment. Specifically, FIG. 11 schematically shows a cross section of the cooling device 5F taken along an XZ plane.

The projector according to this embodiment has components and functions similar to those of the projector 1, except for having the cooling device 5F instead of the cooling device 5A.

As shown in FIG. 11, the cooling device 5F has the casing 51F and the circulation device 52 (not illustrated in FIG. 11).

Similarly to the casing 51, the casing 51F is a sealed casing substantially in the shape of a rectangular parallelepiped in which the image forming unit FU is arranged and whose inside is filled with a cooling liquid, which is an inert liquid. The casing 51F has the openings 511B, 511G, 511R, 511E, each of which is closed by the light-transmissive member 512.

The casing 51F also has a lateral surface part 51F1 situated on the +Z direction side in the casing 51F and situated to the +Z direction side of the light incident-side polarizers 452B, 452R, the light modulation devices 453B, 453R, and the light exiting-side polarizers 454B, 454R. The casing 51F has, on the lateral surface part 51F1, a regulating part 51F2 connected to an outside part of a luminous flux passing area PA on the light exiting surface 455E of the light combining device 455.

The regulating part 51F2 is arranged outside the luminous flux passing area PA so as not to block image light emitted from the light exiting surface 455E of the light combining device 455. The regulating part 51F2 is a site which regulates the inflow of the cooling liquid into the luminous flux passing area PA. The regulating part 51F2 regulates the circulation of the cooling liquid between the light exiting surface 455E and the projection device 46 on the optical path of the image light incident on the projection device 46 from the light exiting surface 455E. That is, the regulating part 51F2 prevents the cooling liquid from circulating between the light combining device 455 and the projection device 46. In this embodiment, such a regulating part 51F2 is formed by connecting the edge forming the opening 511E to the light exiting surface 455E.

As described above, the refractive index of the cooling liquid changes according to temperature. Therefore, when the cooling liquid circulates in the casing 51F and cools the cooling target object, uneven temperature distribution occurs in the cooling liquid and consequently uneven refractive index distribution occurs.

If uneven refractive index distribution occurs in the cooling liquid circulating downstream on the optical path of the light emitted from the light modulation devices 453, the back focus position of the projection device 46 changes and consequently the uneven resolution is observed in the projected image.

The uneven resolution is more conspicuous as the site where the uneven refractive index distribution occurs in the cooling liquid is more distant from the light modulation devices 453, on the downstream side on the optical path (to the light exiting side of the light modulation devices 453). In other words, the uneven resolution is more conspicuous as the site is closer to the projection device 46. For example, in the case where a flow path through which the cooling liquid can circulate is formed between the light modulation devices 453 and the light exiting-side polarizers 454, between the light exiting-side polarizers 454 and the light combining device 455, and between the light exiting surface 455E of the light combining device 455 and the projection device 46, if the uneven refractive index distribution occurs in the cooling liquid circulating between the light combining device 455 and the projection device 46, the uneven resolution becomes the most conspicuous.

Meanwhile, in the cooling device 5F, on the optical path up to the point where the light emitted from the light modulation devices 453 becomes incident on the projection device 46, the cooling liquid is prevented by the regulating part 51F2 from circulating through the most distant inter-optical component area from the light modulation devices 453, that is, the area between the light exiting surface 455E and the projection device 46.

This configuration can restrain conspicuous occurrence of the uneven resolution, compared with the case where the cooling liquid can circulate between the light combining device 455 and the projection device 46.

The degree of occurrence of such uneven resolution varies, depending on the flow path width of the cooling liquid downstream on the optical path from the respective light modulation devices 453 in the configuration of the cooling device 5F, where the cooling liquid circulates in the a direction intersecting the traveling direction of light (dimension along the traveling direction of the light in the flow path of the cooling liquid, that is, liquid thickness). For example, as the flow path width increases, the uneven resolution becomes more conspicuous. As the flow path width decreases, the uneven resolution is observed less conspicuously.

Meanwhile, in the cooling device 5F, the light modulation devices 453, the light exiting-side polarizers 454, and the light combining device 455 are arranged in such a way that the dimension between the light exiting-side polarizers 454 and the light combining device 455 along the optical path of the color light emitted from the respective light modulation devices 453 is smaller than the dimension between the light modulation devices 453 and the light exiting-side polarizers 454 along the optical path. For example, on the optical path of the red light LR, the dimension L2 between the light exiting-side polarizer 454R and the light incident surface 455R of the light combining device 455 is smaller than the dimension L1 between the light modulation device 453R and the light exiting-side polarizer 454R. That is, the flow path width of the cooling liquid circulating between the light exiting-side polarizer 454R and the light incident surface 455R along the direction intersecting the traveling direction of the red light LR passing through the light exiting-side polarizer 454R and the light incident surface 455R is smaller than the flow path width of the cooling liquid circulating between the light modulation device 453R and the light exiting-side polarizer 454R along the direction intersecting the traveling direction of the red light LR.

Thus, the light modulation devices 453 and the light exiting-side polarizers 454 can be cooled while the occurrence of the uneven resolution is restrained.

In the cooling device 5F, as in the foregoing description, the flow velocity of the cooling liquid circulating along the light incident-side polarizer 452, the light modulation device 453, and the light exiting-side polarizer 454 is substantially the same. The flow velocity is substantially the same among the sets of the light incident-side polarizer 452, the light modulation device 453 and the light exiting-side polarizer 454 corresponding to the blue light LB, the green light LG, and the red light LR. However, this configuration is not limiting. The flow velocity of the cooling liquid circulating on a component which needs higher cooling efficiency may be made higher than the flow velocity of the cooling liquid circulating on the other components.

In the cooling device 5F, the cooling liquid circulates counterclockwise around each light incident-side polarizer 452 and circulates counterclockwise around each light exiting-side polarizer 454, as viewed from the +Y direction. In other words, the cooling liquid circulates clockwise around each light modulation device 453, as viewed from the +Y direction. However, the cooling device 5F is not limited to this configuration and may be configured in such a way that the cooling liquid circulates clockwise around each light incident-side polarizer 452 and each light exiting-side polarizer 454, as viewed from the +Y direction. Alternatively, the cooling liquid may not circulate around the light incident-side polarizers 452, the light modulation devices 453, and the light exiting-side polarizers 454.

Effects of Third Embodiment

The projector according to this embodiment described can achieve effects similar to those of the projector 1 and can also achieve the following effects.

The casing 51F has the regulating part 51F2 regulating the inflow of the cooling liquid between the light exiting surface 455E of the light combining device 455 and the projection device 46. This configuration can restrain conspicuous occurrence of the uneven resolution even if the uneven refractive index distribution occurs in the cooling liquid circulating in the casing 51F. Thus, deterioration of a projected image can be restrained.

When the flow path of the cooling liquid circulating along and between the light modulation devices 453 and the light exiting-side polarizers 454 is defined as a first flow path and the flow path of the cooling liquid circulating along and between the light exiting-side polarizers 454 and the light combining device 455 is defined as a second flow path, the dimension L2 of the second flow path along the traveling direction of the light emitted from the light modulation devices 453 (flow path width of the second flow path) is smaller than the dimension L1 of the first flow path along the traveling direction of the light emitted from the light modulation devices 453 (flow path width of the first flow path). That is, the flow path width of the cooling liquid becomes smaller as it goes away from the light modulation devices 453 to the downstream side on the optical path. In other words, the flow path width of the cooling liquid becomes smaller as it goes toward the projection device 46 on the optical path of the light incident on the projection device 46. This configuration can restrain the occurrence of the uneven resolution, compared with the case where the dimension L2 is greater than the dimension L1, as described above.

Moreover, the flow velocity of the cooling liquid in the first flow path and the flow velocity of the cooling liquid in the second flow path are substantially the same. With this configuration, the flow rate of the cooling liquid circulating through the first flow path is higher than the flow rate of the cooling liquid circulating through the second flow path because the dimension L2 (flow path width of the second flow path) is smaller than the dimension L1 (flow path width of the first flow path). Thus, the light modulation devices 453 can be cooled more easily.

Fourth Embodiment

Next, a fourth embodiment of the invention will be described.

A projector according to this embodiment has a configuration similar to that of the projector 1 but differs from the projector 1 in the direction of circulation of the cooling liquid. In the description below, parts that are the same or substantially the same as those already described are denoted by the same reference signs and are not described further in detail.

Figure 12:
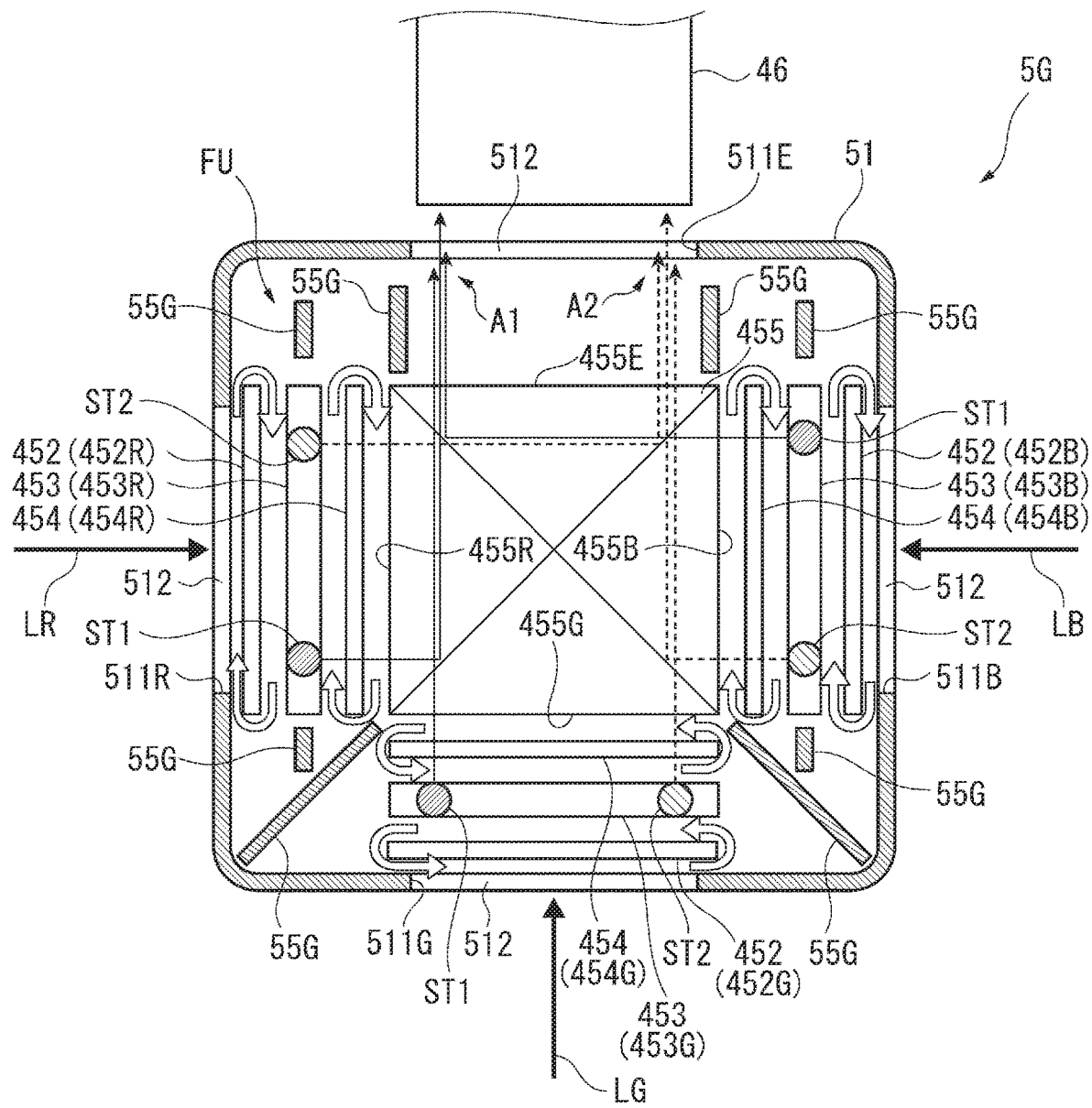
FIG. 12 is a schematic view showing a cooling device of a projector according to a fourth embodiment of the invention.

FIG. 12 is a schematic view showing a cooling device 5G provided in the projector according to this embodiment. Specifically, FIG. 12 schematically shows a cross section of the cooling device 5G taken along an XZ plane and schematically shows the direction of circulation of the cooling liquid in the cooling device 5G and the optical path of each color light passing through each light modulation device 453 and becoming incident on the projection device 46 via the light combining device 455.

The projector according to this embodiment has components and functions similar to those of the projector 1, except for having the cooling device 5G instead of the cooling device 5A.

As shown in FIG. 12, the cooling device 5G has the casing 51 and the circulation device 52 (not illustrated in FIG. 12) and also has a plurality of demarcation members 55G.

The plurality of demarcation members 55G divide the space inside the casing 51 and thus adjusts the direction of circulation of the cooling liquid stirred and circulated by the circulation device 52. In other words, the plurality of demarcation members 55G function as flow rectification members which rectify the flow of the cooling liquid.

Specifically, the plurality of demarcation members 55G cause the cooling liquid to circulate from the side of a site ST1 corresponding to an area A1 on one end side of the image light combined by the light combining device 455 and becoming incident on the projection device 46 to the side of a site ST2 corresponding to an area A2 on the other end side of the image light, in the light exiting-side of each light modulation device 453. Here, the site ST1 is a site on one end side to modulate the light corresponding to the area A1 on the one end side of the image light incident on the projection device 46 from the light combining device 455, in each light modulation device 453. The site ST2 is a site on the other end side to modulate the light corresponding to the area A2 on the other end side of the image light incident on the projection device 46, in each light modulation device 453.

In the image forming unit FU, the light modulation devices 453B, 453G, 453R are arranged in such a way as to face the three light incident surfaces 455B, 455G, 455R next to each other in the light combining device 455 having the shape of a rectangular parallelepiped. The green light LG travels along the +Z direction, passes through the light incident-side polarizer 452, the light modulation device 453G and the light exiting-side polarizer 454, then passes through the light combining device 455, and becomes incident on the projection device 46. The blue light LB travels along the +X direction, passes through the light incident-side polarizer 452, the light modulation device 453B and the light exiting-side polarizer 454, is subsequently reflected into the +Z direction at the light combining device 455, and becomes incident on the projection device 46. The red light LR travels along the −X direction, passes through the light incident-side polarizer 452, the light modulation device 453R and the light exiting-side polarizer 454, is subsequently reflected into the +Z direction at the light combining device 455, and becomes incident on the projection device 46.

Therefore, in the light modulation device 453G situated to the −Z direction side of the light combining device 455 and arranged along an XY plane, the site ST1 to modulate the light corresponding to the area A1 (area on one end side) on the +X direction side of the image light incident on the projection device 46 is a site on the +X direction side. In the light modulation device 453G, the site ST2 to modulate the light corresponding to the area A2 (area on the other end side) on the −X direction side of the image light is a site on the −X direction side.

Similarly, in the light modulation device 453B situated to the −X direction side of the light combining device 455 and arranged along a YZ plane, the site ST1 to modulate the light corresponding to the area A1 is a site on the +Z direction side and the site ST2 to modulate the light corresponding to the area A2 is a site on the −Z direction side. In the light modulation device 453R situated to the +X direction side of the light combining device 455 and arranged along a YZ plane, the site ST1 is a site on the −Z direction side and the site ST2 is a site on the +Z direction side.

Incidentally, when the cooling liquid circulates from one end side to the other end side of the light modulation devices 453, the temperature of the cooling liquid tends to be higher and the refractive index tends to be lower on the other end side, which is the downstream side in the direction of circulation of the cooling liquid.

Unless the light passing through the area where the refractive index of the cooling liquid is lower in each light modulation device 453 is situated in the same area in the image light incident on the projection device 46, and the light passing through the area where the refractive index of the cooling liquid is higher in each light modulation device 453 is situated in the same area in the image light, uneven color is observed conspicuously in the projected image. In other words, unless the light passing through the area where the refractive index of the cooling liquid is lower and the light passing through the refractive index is higher, of each color light modulated by each of the light modulation devices 453B, 453G, 453R, form the same areas in the image light, uneven color is observed conspicuously in the projected image.

Meanwhile, in the cooling device 5G, due to the side the circulation device 52 and the plurality of demarcation members 55G, the cooling liquid, circulating in the opposite directions on the light incident side and the light exiting side of each of the light incident-side polarizers 452 and the light exiting-side polarizers 454, circulates from the side of the site ST2 to the side of the site ST1 on the light incident side of the light modulation devices 453 and circulates from the side of the site ST1 to the side of the site ST2 on the light exiting side of the light modulation devices 453. That is, the direction of circulation of the cooling liquid circulating along the light incident-side surface of each light modulation device 453 is substantially the same among the respective light modulation devices 453 in the direction connecting the site ST1 (site on one end side) and the site ST2 (site on the other end side). Also, the direction of circulation of the cooling liquid circulating along the light exiting-side surface of each light modulation device 453 is substantially the same among the respective light modulation devices 453 in the direction connecting the site ST1 (site on one end side) and the site ST2 (site on the other end side).

For example, with respect to the light modulation device 453G, the cooling liquid circulates from the side of the site ST2 to the side of the site ST1 on the light incident side of the light modulation device 453G and circulates from the side of the ST1 to the side of the site ST2 on the light exiting side. The same applies to the cooling liquid circulating on the other light modulation devices 453B, 453R.

Such circulation of the cooling liquid can make the direction from the site ST2 to the site ST1 coincident with the direction of circulation of the cooling liquid on the light incident side of each light modulation device 453. Similarly, the direction from the site ST1 to the site ST2 can be made coincident with the direction of circulation of the cooling liquid on the light exiting side of each light modulation device 453. Thus, uneven color and uneven resolution can be restrained from occurring conspicuously in the projected image.

In each light modulation device 453, the upstream side in the direction of circulation of the cooling liquid is reversed between the light incident side and the light exiting side of the light modulation device 453, and the downstream side in the direction of circulation is reversed between the light incident side and the light exiting side of the light modulation device 453. Thus, the light modulation devices 453 can be cooled substantially evenly.

Effects of Fourth Embodiment

The projector according to this embodiment described above can achieve effects similar to those of the projector 1 and can also achieve the following effects.

The direction of circulation of the cooling liquid circulating on the light incident side of each light modulation device 453 is the same among the respective light modulation devices 453 in the direction connecting the site ST1 and the site ST2. The cooling liquid circulates on the light incident side from the side of the site ST2 to the side of the ST1. Thus, the modulated lights modulated by the respective light modulation devices 453 become incident on the projection device 46 as modulated lights having the same illuminance distribution. Therefore, projection of an image in which the illuminance distribution differs from one color to another can be restrained. Even if the uneven illuminance occurs, the uneven color can be restrained from becoming conspicuous in the projected image.

The direction of circulation of the cooling liquid circulating on the light exiting side of each light modulation device 453 is the same among the respective light modulation devices 453 in the direction connecting the site ST1 and the site ST2. The cooling liquid circulates on the light exiting side from the side of the site ST1 to the side of the site ST2. Thus, modulated lights modulated by the respective light modulation devices 453 and passing through the cooling liquid become incident on the projection device 46 as modulated lights having the same distribution of uneven resolution. Therefore, even if the uneven resolution occurs, projection of an image in which the distribution of the uneven resolution differs from one color to another can be restrained and the uneven resolution can be restrained from becoming conspicuous.

Modification of Fourth Embodiment

In the cooling device 5G, the cooling liquid circulates from the side of the site ST2 to the side of the site ST1 on the light incident side of the light modulation devices 453 and circulates from the side of the site ST1 to the side of the site ST2 on the light exiting side. However, the direction of circulation of the cooling liquid circulating on the light incident side and the light exiting side of each light modulation device 453 may be the reverse of the foregoing directions. Also, the direction of circulation of the cooling liquid circulating on the light incident side and the light exiting side may be the same.

The cooling liquid may circulate in the −Y direction or the +Y direction on the light incident side and the light exiting side of each of the respective light incident-side polarizers 452, the respective light modulation devices 453, and the respective light exiting-side polarizers 454. In this case, one of the area A1 on the one end side and the area A2 on the other end side of the image light is an area on the +Y direction side, and the other is an area on the −Y direction side. Even in this case, the site ST1 in each light modulation device 453 is the site to modulate the light corresponding to the area A1, and the site ST2 is the site to modulate the light corresponding to the area A2. Even in the case where the cooling liquid circulates in this way, effects similar to those of the cooling device 5G can be achieved. The directions of circulation of the cooling liquid circulating on the light incident side and the light exiting side of the light modulation devices 453 may be the same or may be opposite to each other.

Also, instead of being arranged on the flow path of the cooling liquid circulating on the light incident-side polarizers 452 and the light exiting-side polarizers 454, the light modulation devices 453 may be arranged in a flow path of the cooling liquid that is different from the foregoing flow path. For example, the cooling device may be configured by providing a demarcation member connecting the respective light modulation devices 453 between the demarcation members 53C, 54C, so that the directions of circulation of the cooling liquid circulating on the light incident side and the light exiting side of the light modulation devices 453 are opposite to each other. In this case, the cooling liquid may or may not circulate around the light modulation devices 453.

Fifth Embodiment

Next, a fifth embodiment of the invention will be described.

A projector according to this embodiment has a configuration similar to that of the projector 1 but the cooling device has a cooling mechanism which circulates the cooling liquid outside the casing 51 and thus cools the components. In this respect, the projector according to this embodiment differs from the projector 1. In the description below, parts that are the same or substantially the same as those already described are denoted by the same reference signs and are not described further in detail.

Figure 13:
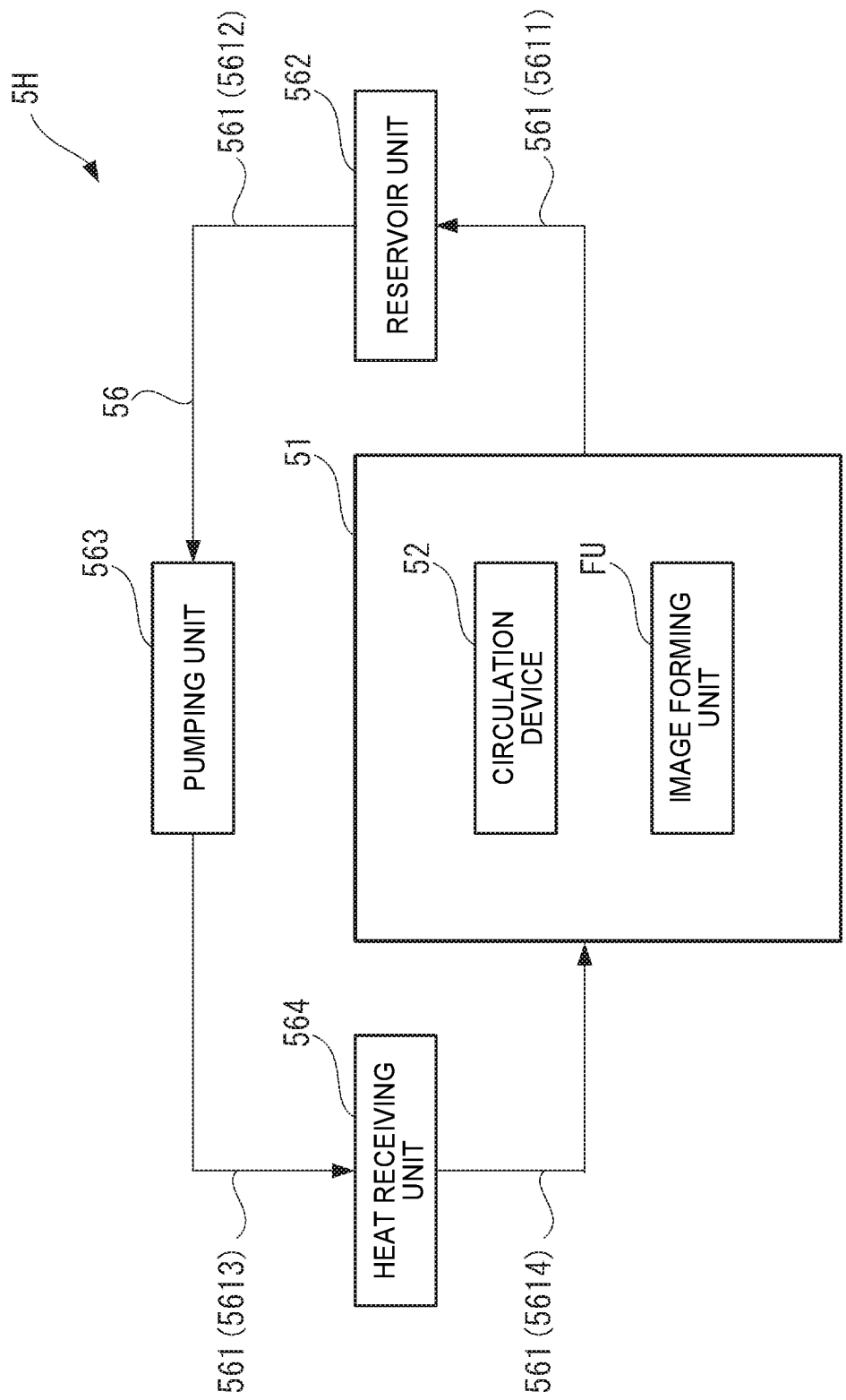
FIG. 13 is a block diagram showing a cooling device of a projector according to a fifth embodiment of the invention.

FIG. 13 is a block diagram showing the overall configuration of a cooling device 5H provided in the projector according to this embodiment.

The projector according to this embodiment has components and functions similar to those of the projector 1, except for having the cooling device 5H instead of the cooling device 5A.

Similarly to the cooling device 5A, the cooling device 5H has the casing 51 filled with the cooling liquid and the circulation device 52 and also has an external cooling mechanism 56 which cools the cooling liquid in the casing 51, outside the casing 51, as shown in FIG. 13.

The external cooling mechanism 56 has a plurality of pipes 561 (5611 to 5614), a reservoir unit 562, a pumping unit 563, and a heat receiving unit 564.

The plurality of pipes 561 (5611 to 5614) has the cooling liquid circulating inside and connects the casing 51, the reservoir unit 562, the pumping unit 563, and the heat receiving unit 564 in such a way that the cooling liquid can circulates. Specifically, the pipe 5611 connects the casing 51 to the reservoir unit 562. The pipe 5612 connects the reservoir unit 562 to the pumping unit 563. The pipe 5613 connects the pumping unit 563 to the heat receiving unit 564. The pipe 5614 connects the heat receiving unit 564 to the casing 51.

The reservoir unit 562 is a so-called tank and provided outside the casing 51. The reservoir unit 562 temporarily stores therein the cooling liquid flowing in from the casing 51 via the pipe 5611. The reservoir unit 562 also has the function of securing air bubbles if the air bubbles enter the cooling liquid.

The pumping unit 563 is a so-called pump and provided outside the casing 51. The pumping unit 563 pumps out the cooling liquid stored in the reservoir unit 562 to the heat receiving unit 564 via the pipe 5613.

The heat receiving unit 564 is a so-called heat exchanger (radiator) and provided outside the casing 51. The heat receiving unit 564 receives the heat of the cooling liquid flowing in via the pipe 5613 and radiates the heat outside, thus cooling the cooling liquid. The cooling liquid cooled by such a heat receiving unit 564 is circulated to the casing 51 via the pipe 5614. The heat receiving unit 564 may be provided with a cooling fan for cooling.

Although not illustrated in detail, for example, the pipe 5614, connected at its one end to the heat receiving unit 564, is connected at its other end to the lateral surface part in the −Y direction of the casing 51. The pipe 5611, connected at its one end to the reservoir unit 562, is connected at its other end to the lateral surface part in the +Y direction of the casing 51. Therefore, the cooling liquid cooled by the heat receiving unit 564 is supplied from the bottom surface of the casing 51 and discharged from the top surface of the casing 51 into the external cooling mechanism 56. Thus, the inside of the casing 51 can be filled with the cooling liquid and the image forming unit FU can be immersed in the cooling liquid.

In such a cooling device 5H, when the pumping unit 563 is driven, the cooling liquid flowing in the reservoir unit 562 from the casing 51 and stored there is supplied to the heat receiving unit 564. The cooling liquid cooled by the heat receiving unit 564 is supplied to the casing 51. Thus, the cooling liquid with a low temperature is supplied into the casing 51. This cooling liquid is circulated on each component of the image forming unit FU by the circulation device 52 and cools the image forming unit FU.

Since the image forming unit FU can be cooled in this way by the cooling liquid cooled by the heat receiving unit 564, the image forming unit FU can be cooled more effectively.

The order in which the cooling liquid circulates through the reservoir unit 562, the pumping unit 563 and the heat receiving unit 564 in the external cooling mechanism 56 laid out on the outside of the casing 51 via the pipes 561 from the casing 51, can be changed where appropriate. The configuration inside the casing 51 may be the same as any of the foregoing configurations. The direction of circulation of the cooling liquid may be the same as or different from any of the foregoing configurations. The number and arrangement of the circulation devices 52 inside the casing 51 can be changed where appropriate. Also, the cooling device 5H may have a casing 51F instead of the casing 51.

Also, for example, the pipe 5614, connected at its one end to the heat receiving unit 564, may be connected at its other end to a site on the −Y direction side of one of the lateral surface parts in the ±X directions and the ±Z directions of the casing 51. The pipe 5611, connected at its one end to the reservoir unit 562, may be connected at its other end to a site on the +Y direction side of one of the lateral surface parts in the ±X directions and the ±Z directions of the casing 51. In this case, the other end of the pipe 5614 may be connected to a site on the −Y direction side of one lateral surface part, of the lateral surface parts in the ±X directions and the ±Z directions, and the other end of the pipe 5611 may be connected to a site on the +Y direction side of a lateral surface part that is not the one lateral surface, of the lateral surface parts in the ±X directions and the ±Z directions. Also, the other end of the pipe 5611 may be connected to a site that is on the same lateral surface part as the lateral surface part to which the other end of the pipe 5614 is connected and that is to the +Y direction side from the site to which the other end of the pipe 5614 is connected. Moreover, for example, if the −Y direction is parallel to the vertical direction, the pipe 5614 allowing the cooling liquid to flow into the casing 51 may be connected to a site on the lower side in the vertical direction of the casing 51, and the pipe 5611 allowing the cooling liquid to flow out of the casing 51 may be connected to a site on the upper side in the vertical direction of the casing 51.

Effects of Fifth Embodiment

The projector according to this embodiment described above can achieve effects similar to those of the projector 1 and can also achieve the following effects.

The cooling liquid stored in the reservoir unit 562 and pumped out by the pumping unit 563 is supplied into the casing 51. This configuration can restrain the inside of the casing 51 from becoming short of the cooling liquid. Thus, the inside of the casing 51 can be filled with the cooling liquid more easily.

The heat receiving unit 564 receives the heat of the cooling liquid flowing in via the pipe 5613. Therefore, the external cooling mechanism 56 can supply the cooling liquid cooled by the heat receiving unit 564, to the casing 51. Thus, the cooling liquid can be cooled outside the casing 51 and the image forming unit FU cooled by the cooling liquid can be cooled more effectively.

Modifications of Embodiments

The invention is not limited to the embodiments. Modifications, improvements and the like within a range that can achieve the object of the invention are included in the invention.

For example, the configurations of the cooling devices 5A to 5H may be combined together. As an example, one of the cooling devices 5A, 5B, one of the cooling devices 5C to 5E, and the cooling devices 5F, 5G, 5H may be combined together. Also, the content and configuration described as a modification of the cooling device in each of the embodiments may be combined with another cooling device.

In the embodiments, the light incident-side polarizers 452 situated to the light incident side of the light modulation devices 453 are cooled by the cooling liquid in the casing 51 circulating in the opposite directions on the light incident side and the light exiting side. The light exiting-side polarizers 454 situated to the light exiting side of the light modulation devices 453 are cooled by the cooling liquid in the casing 51 circulating in the opposite directions on the light incident side and the light exiting side. However, this configuration is not limiting. Also, only the light incident-side polarizers 452 or only the light exiting-side polarizers 454 may be cooled by the cooling liquid. Also, only one of the three light incident-side polarizers 452B, 452G, 452R may be cooled by the cooling liquid. Moreover, only one of the three light exiting-side polarizers 454B, 454G, 454R may be cooled by the cooling liquid. That is, there may be a polarizer that is arranged to the light incident side and the light exiting side of the light modulation devices 453 and cooled by the cooling liquid circulating in the opposite directions on the light incident side and the light exiting side.

Even if another optical component is arranged between the light incident-side polarizers 452 and the light modulation devices 453, the light incident-side polarizers 452 are polarization elements situated to the light incident side of the light modulation devices 453. Even if another optical component is arranged between the light modulation devices 453 and the light exiting-side polarizers 454, the light exiting-side polarizers 454 are polarization elements situated to the light exiting side of the light modulation devices 453.

In the embodiments, the flow velocity of the cooling liquid circulating on the light incident side of one polarizer of the light incident-side polarizers 452 and the light exiting-side polarizers 454 and the flow velocity of the cooling liquid circulating on the light exiting side of the one polarizer are substantially the same. However, this is not limiting. These flow velocities may be different from each other.

In the embodiments, of the light exiting-side polarizers 454, the light exiting-side polarizer 454G, through which the green light LG passes, is cooled by the cooling liquid circulating in the opposite directions on the light incident side and the light exiting side. However, this is not limiting. The light exiting-side polarizer 454G may be cooled by the cooling liquid circulating in the same direction on the light incident side and the light exiting side, and at least one of the light exiting-side polarizer 454B, 454R may be cooled by the cooling liquid circulating in the opposite directions on the light incident side and the light exiting side. The same applies to the light incident-side polarizers 452.

In the embodiments, the image projection device 4 has the color separation device 43 separating the light emitted from the light source 41 into the blue light LB, the green light LG, and the red light LR. However, this is not limiting. The image projection device 4 may have a light source which emits the blue light LB, a light source which emits the green light LG, and a light source which emits the red light LR, instead of the light source 41.

The light incident-side polarizer 452G, the light modulation device 453G, and the light exiting-side polarizer 454G, through which the green light LG passes, may be omitted. That is, the light incident-side polarizer 452, the light modulation device 453, and the light exiting-side polarizer 454 may not be provided corresponding to each of the blue, green, and red color lights, and may be provided corresponding to another color light.

In the embodiments, the wire grid polarization element PP is employed for the light incident-side polarizers 452 and the light exiting-side polarizers 454. However, this is not limiting. Polarization elements of other configurations may be employed for the light incident-side polarizers 452 and the light exiting-side polarizers 454.

If the cooling efficiency for the polarizers 452, 454 is not taken into account, the cooling liquid may circulate along the direction of arrangement of the protruding parts PP3 (+N direction).

In the embodiments, a fluorine-based inert liquid is employed as the cooling liquid. However, this is not limiting. The composition of the cooling liquid is not limited to this, provided that the light modulation devices 453 immersed in the cooling liquid can be driven stably.

In the embodiments, the openings 511B, 511G, 511R of the casings 51, 51F are closed by the light-transmissive member 512. However, this is not limiting. For example, the openings 511B, 511G, 511R may be closed by a color filter (optical filter) or the field lens 451. In this case, the openings 511B, 511G, 511R may be closed from inside the casings 51, 51F or may be closed from outside.

In a configuration where the cooling liquid does not circulate on the light incident side of the light incident-side polarizers 452, the openings 511B, 511G, 511R may be closed by the light incident-side polarizers 452. In this case, too, the light incident-side polarizers 452 may close the openings 511B, 511G, 511R from inside the casing 51 or from outside.

The light modulation device employed in the embodiments may have a drive unit (for example, drive IC (integrated circuit)) which drives a plurality of display elements (pixels) in the light modulation device according to image information inputted to the light modulation device, on each signal line connected to the control device. Particularly a light modulation device that can form a high-resolution image such as 4K or 8K may have such a configuration. Such drive units generate heat when driving the display elements of the light modulation device. Therefore, even if such light modulation devices are employed as the light modulation devices 453, the cooling device in each of the embodiments can efficiently cool the drive units attached to the signal lines of the light modulation devices 453.

In the embodiments, the projector has the three light modulation devices 453 (453B, 453G, 453R), each having a liquid crystal panel. However, this is not limiting. The invention can also be applied to a projector having two or fewer light modulation devices, or four or more light modulation devices.

In the embodiments, the image projection device 4 is configured with the layout and optical components shown in FIG. 11, as an example. However, this is not limiting. An image projection device 4 having other layouts and optical components may be employed.

In the embodiments, the light modulation device 453 has a transmission-type liquid crystal panel whose light incident surface and light exiting surface are different from each other. However, the light modulation device 453 is not limited to this configuration and may have a reflection-type liquid crystal panel whose light incident surface and light exiting surface are the same. Also, a light modulation device that does not employ liquid crystal, such as a light modulation device using a micromirror, for example, DMD (digital micromirror device), may be used, provided that the device can modulate an incident luminous flux and form an image corresponding to image information.

The entire disclosure of Japanese Patent Application No. 2018-013008, filed Jan. 29, 2018 and No. 2018-177363, filed Sep. 21, 2018 are expressly incorporated by reference herein.

What is claimed is:

1. A projector comprising:
a light source;
a light modulation device configured to modulate light emitted from the light source;
a polarization element arranged to one of a light incident side and a light exiting side of the light modulation device;
a projection device configured to project the light modulated by the light modulation device;
a casing in which the polarization element is arranged and whose inside is filled with a cooling liquid, wherein the polarization element is immersed in the cooling liquid; and
an impeller configured to circulate the cooling liquid in the casing onto the polarization element,
wherein the cooling liquid
circulates along a first direction on the light incident side of the polarization element, and
circulates along a second direction opposite to the first direction on the light exiting side of the polarization element, and
wherein a flow speed of the cooling liquid circulating on the light incident side of the polarization element is substantially the same as a flow speed of the cooling liquid circulating on the light exiting side of the polarization element.

2. The projector according to claim 1,
wherein the polarization element is disposed on the light exiting side of the light modulation device.

3. The projector according to claim 2, further comprising:
a plurality of the light modulation devices corresponding respectively to a plurality of color lights including green light; and
a light combining device configured to combine the color lights modulated respectively by the plurality of the light modulation devices,
wherein the polarization element is disposed on the light exiting side of the light modulation device corresponding to the green light.

4. The projector according to claim 1,
wherein the polarization element is disposed on the light incident side of the light modulation device.

5. The projector according to claim 1,
wherein the polarization element has a plurality of protrusions extending along a predetermined direction and arranged in a direction intersecting the predetermined direction, on one surface of a light incident surface and a light exiting surface, and
wherein the cooling liquid circulating on the one surface circulates along the predetermined direction in which the plurality of protrusions extend.

6. The projector according to claim 1,
wherein the cooling liquid is a fluorine-based inert liquid.

7. The projector according to claim 1,
wherein the cooling liquid circulates continuously from the light incident side of the polarizing element, to an end side of the polarizing element, and to the light exiting side of the polarizing element.

8. A projector comprising:
a light source;
a light modulation device configured to modulate light emitted from the light source;
a polarization element arranged to one of a light incident side and a light exiting side of the light modulation device;
a projection device configured to project the light modulated by the light modulation device;
a casing in which the polarization element is arranged and whose inside is filled with a cooling liquid, wherein the polarization element is immersed in the cooling liquid; and
an impeller configured to circulate the cooling liquid in the casing onto the polarization element,
wherein the cooling liquid
 circulates along a first direction on the light incident side of the polarization element,
 circulates along a second direction opposite to the first direction on the light exiting side of the polarization element, and
 circulates continuously from the light incident side of the polarization element, to an end side of the polarizing element, and to the light exiting side of the polarizing element.

* * * * *